(12) United States Patent
Jeong et al.

(10) Patent No.: US 8,288,289 B2
(45) Date of Patent: Oct. 16, 2012

(54) METHOD OF FABRICATING SEMICONDUCTOR DEVICE

(75) Inventors: Jun-Ho Jeong, Suwon-si (KR);
Jang-Eun Lee, Suwon-si (KR);
Se-Chung Oh, Suwon-si (KR);
Suk-Hun Choi, Suwon-si (KR);
Jea-Hyoung Lee, Seoul (KR); Woo-Jin Kim, Yongin-si (KR); Woo-Chang Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/016,228

(22) Filed: Jan. 28, 2011

(65) Prior Publication Data

US 2011/0189851 A1  Aug. 4, 2011

(30) Foreign Application Priority Data

Jan. 29, 2010  (KR) ........................ 10-2010-0008756

(51) Int. Cl.
*H01L 21/302*  (2006.01)

(52) U.S. Cl. .. 438/717; 438/671; 438/669; 257/E21.023

(58) Field of Classification Search ................ 438/717, 438/671, 669; 257/E21.023
See application file for complete search history.

(56) References Cited

U.S. PATENT DOCUMENTS

| 7,473,641 B2* | 1/2009 | Ho et al. ........................ 438/672 |
| 2006/0097333 A1* | 5/2006 | Jeong et al. .................... 257/425 |
| 2010/0015801 A1* | 1/2010 | Choi et al. ..................... 438/658 |

FOREIGN PATENT DOCUMENTS

| JP | 2000-012920 A | 1/2000 |
| KR | 10 2004-0060312 A | 7/2004 |
| KR | 10 2004-0110482 A | 12/2004 |

* cited by examiner

*Primary Examiner* — Julia Slutsker
(74) *Attorney, Agent, or Firm* — Lee & Morse, P.C.

(57) ABSTRACT

A method of fabricating a semiconductor device, the method including providing a substrate; forming an underlying layer on the substrate; forming a sacrificial layer on the underlying layer; forming an opening in the sacrificial layer by patterning the sacrificial layer such that the opening exposes a predetermined region of the underlying layer; forming a mask layer in the opening; forming an oxide mask by partially or completely oxidizing the mask layer; removing the sacrificial layer; and etching the underlying layer using the oxide mask as an etch mask to form an underlying layer pattern.

20 Claims, 21 Drawing Sheets

METHOD OF FABRICATING SEMICONDUCTOR DEVICE

BACKGROUND

1. Field

Embodiments relate to a method of fabricating a semiconductor device.

2. Description of Related Art

To improve a degree of integration and performance of a semiconductor device, a high technology semiconductor fabrication process may be desirable.

SUMMARY

Embodiments are directed to a method of fabricating a semiconductor device.

At least one of the above and other features and advantages may be realized by providing a method of fabricating a semiconductor device, the method including providing a substrate; forming an underlying layer on the substrate; forming a sacrificial layer on the underlying layer; forming an opening in the sacrificial layer by patterning the sacrificial layer such that the opening exposes a predetermined region of the underlying layer; forming a mask layer in the opening; foaming an oxide mask by partially or completely oxidizing the mask layer; removing the sacrificial layer; and etching the underlying layer using the oxide mask as an etch mask to form an underlying layer pattern.

The mask layer may be formed of a metal layer.

The oxide mask may be formed of a conductive metal oxide.

The method may further include performing a process of decreasing a thickness of the oxide mask.

The method may further include partially planarizing the oxide mask to reduce a thickness of the oxide mask.

Forming the mask layer may include generating a defect in an upper region of the mask layer, and forming the oxide mask may include removing the defect.

The oxide mask may have a resistance value of less than half of a resistance value of the underlying layer.

The sacrificial layer may have a thickness of a first dimension, the opening may have a width of a second dimension, and the first dimension may be about 0.5 to about 1.5 times the second dimension.

A height of a mask structure including the mask layer and the oxide mask may be about 1 to about 3 times a thickness of the underlying layer.

The height of the mask structure including the mask layer and the oxide mask may be about 1 to about 1.5 times the thickness of the underlying layer.

Forming the mask layer may include forming a conductive material layer on the substrate including the sacrificial layer having the opening, and planarizing the conductive material layer until a top surface of the sacrificial layer is exposed.

The oxide mask may include a portion extending above the sacrificial layer.

The oxide mask may have a sidewall substantially perpendicular to a surface of the underlying layer.

The oxide mask may include a first portion having a first width and a second portion having a second width, the second width being greater than the first width.

The first portion of the oxide mask may be in the opening, and the second portion of the oxide mask may be on the first portion.

The second width of the second portion of the oxide mask may be gradually increased from an interface with the first portion toward a top thereof.

Forming the mask layer may include partially filling the opening.

The method may further include forming a spacer on a sidewall of the opening prior to forming the mask layer; and removing the spacer with the sacrificial layer prior to forming the underlying layer pattern.

The underlying layer may include a data storage material layer, the data storage material layer remaining in the underlying layer pattern and forming a data storage pattern, the data storage pattern being an element for storing data of a non-volatile RAM.

At least one of the above and other features and advantages may also be realized by providing a method of fabricating a semiconductor device, the method including providing a substrate having a switching device; forming an underlying layer on the substrate, the underlying layer including a sequentially stacked conductive lower layer, data storage layer, and conductive upper layer, the conductive lower layer being in electrical contact with the switching device; forming a sacrificial layer on the underlying layer; patterning the sacrificial layer to form an opening exposing a predetermined region of the underlying layer; forming a metal layer in the opening; partially or completely oxidizing the metal layer to form an oxide mask formed of a conductive metal oxide; removing the sacrificial layer; etching the underlying layer using the oxide mask as an etch mask to form an underlying layer pattern, the underlying layer pattern including a sequentially stacked lower pattern, data storage pattern, and upper pattern, the data storage pattern being a data storage element of a non-volatile memory device; forming an inter-metal insulating layer on the substrate having the underlying layer pattern; and forming a conductive line in electrical contact with the oxide mask on the inter-metal insulating layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
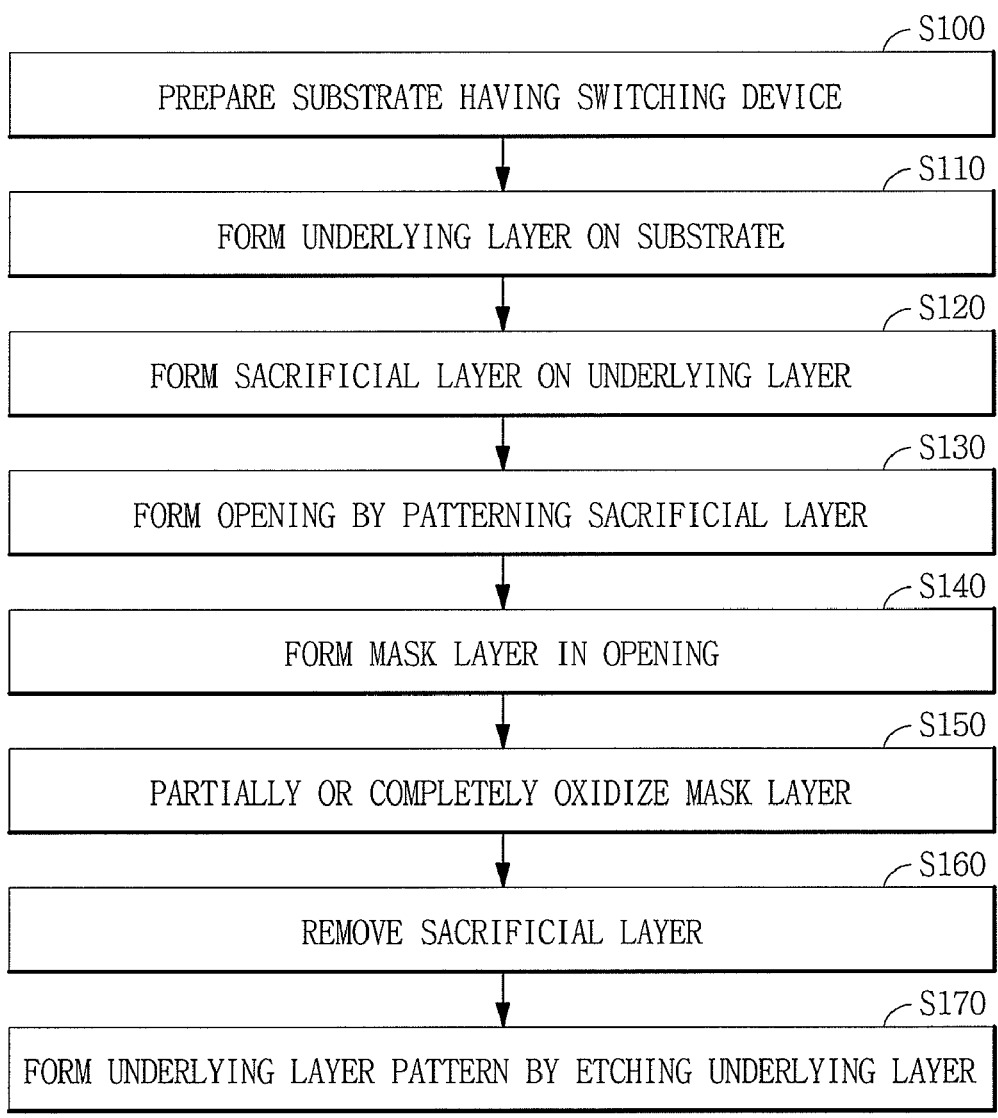
FIGS. 1 through 4 illustrate flowcharts showing methods of fabricating a semiconductor device according to some embodiments.

Korean Patent Application No. 10-2010-0008756, filed on Jan. 29, 2010, in the Korean Intellectual Property Office, and entitled: "Method of Fabricating Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Detailed illustrative embodiments are disclosed herein. However, specific structural and functional details disclosed herein are merely representative for purposes of describing example embodiments.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

FIGS. 1 through 4 illustrate flowcharts showing methods of fabricating a semiconductor device according to some embodiments. Methods of fabricating a semiconductor device according to the embodiments will be described with reference to FIGS. 1 through 4.

A method of fabricating a semiconductor device according to an embodiment will be described with reference to FIG. 1.

Referring to FIG. 1, a substrate having a switching device may be prepared (S100). The switching device may include, e.g., a transistor or a diode. An underlying layer may be formed on the substrate (S110). The underlying layer may be a subject for patterning. The underlying layer may be a layer including, e.g., a data storage material of a memory device. For example, the underlying layer may include an element for storing data of a non-volatile RAM.

A sacrificial layer may be formed on the underlying layer (S210). The sacrificial layer may be formed of, e.g., a silicon oxide layer or a silicon nitride layer.

An opening passing through the sacrificial layer and exposing a predetermined region of the underlying layer may be formed by patterning the sacrificial layer (S130). In a plan view, the opening may have various shapes, e.g., circular, oval, and/or tetragonal shapes.

A mask layer may be formed in the opening (S140). The mask layer may be formed of a metal layer including a metal material, e.g., tungsten.

The mask layer may be partially or completely oxidized (S150). For example, when the mask layer is formed of a tungsten layer, the oxidized layer may include a tungsten oxide layer. The oxidized layer may constitute an oxide mask.

The sacrificial layer may be removed by etching (S160). Subsequently, the underlying layer may be etched using the oxidized layer, e.g., the oxide mask, as an etch mask, thereby forming an underlying layer pattern (S170).

Next, a method of fabricating a semiconductor device according to another embodiment will be described with reference to FIG. 2.

Figure 2:
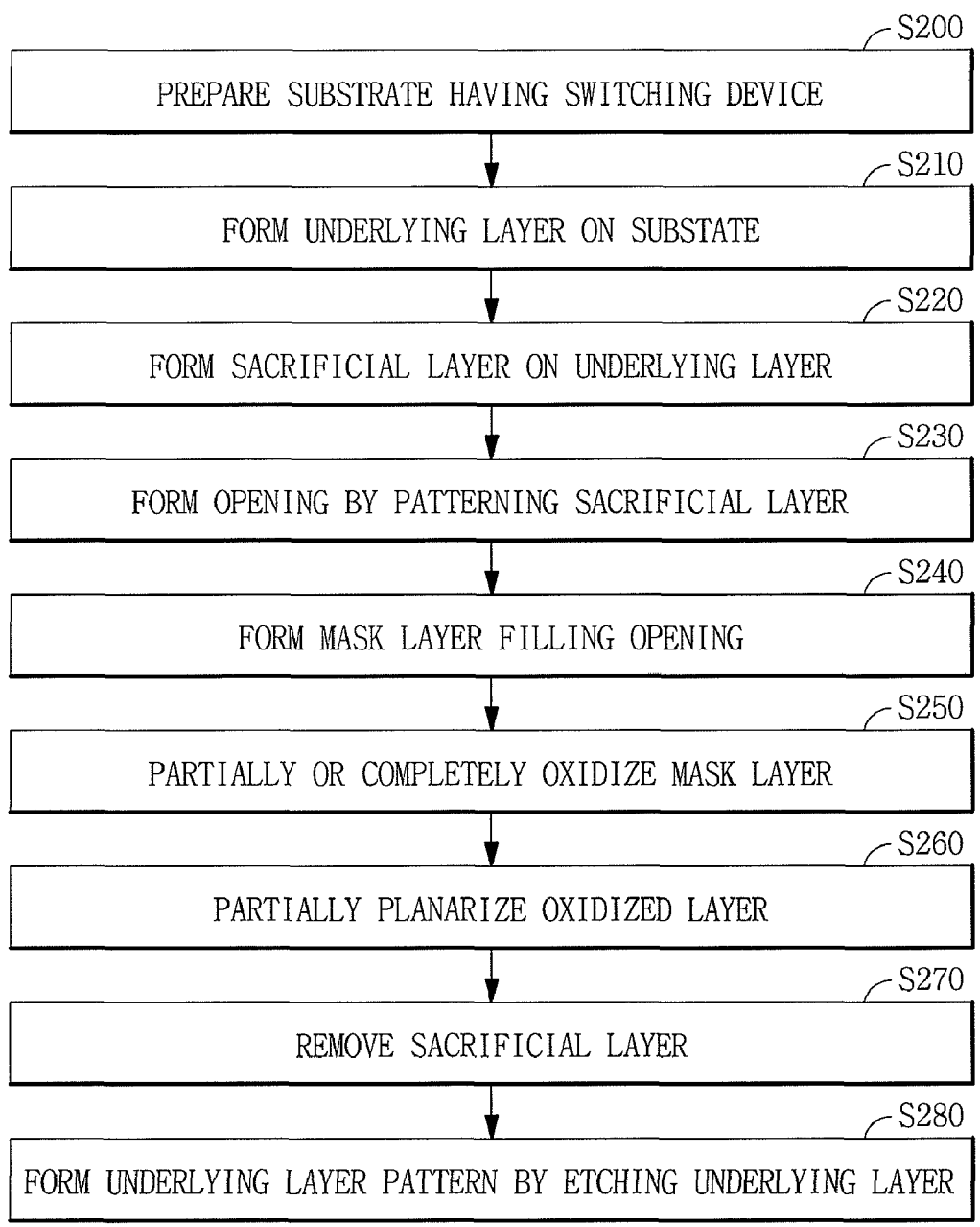

Referring to FIG. 2, similar to the embodiment illustrated in FIG. 1, a substrate having a switching device may be prepared (S200), an underlying layer may be formed on the substrate (S210), and a sacrificial layer may be formed on the underlying layer (S220) and patterned, thereby forming an opening (S230).

A mask layer filling the opening may be formed (S240). The mask layer may be formed of a metal layer including a metal material, e.g., tungsten. The mask layer may be partially or completely oxidized (S250). For example, when the mask layer is formed of a tungsten layer, the oxidized layer may include a tungsten oxide layer.

The oxidized layer may be partially planarized (S260). For example, the oxidized mask layer may be partially planarized such that the oxidized portion of the mask layer partially remains.

The sacrificial layer may be removed by etching (S270). Subsequently, the underlying layer may be etched using the oxidized layer remaining after the partial planarization as an etch mask, thereby forming an underlying layer pattern (S280).

Next, a method of fabricating a semiconductor device according to yet another embodiment will be described with reference to FIG. 3.

Figure 3:
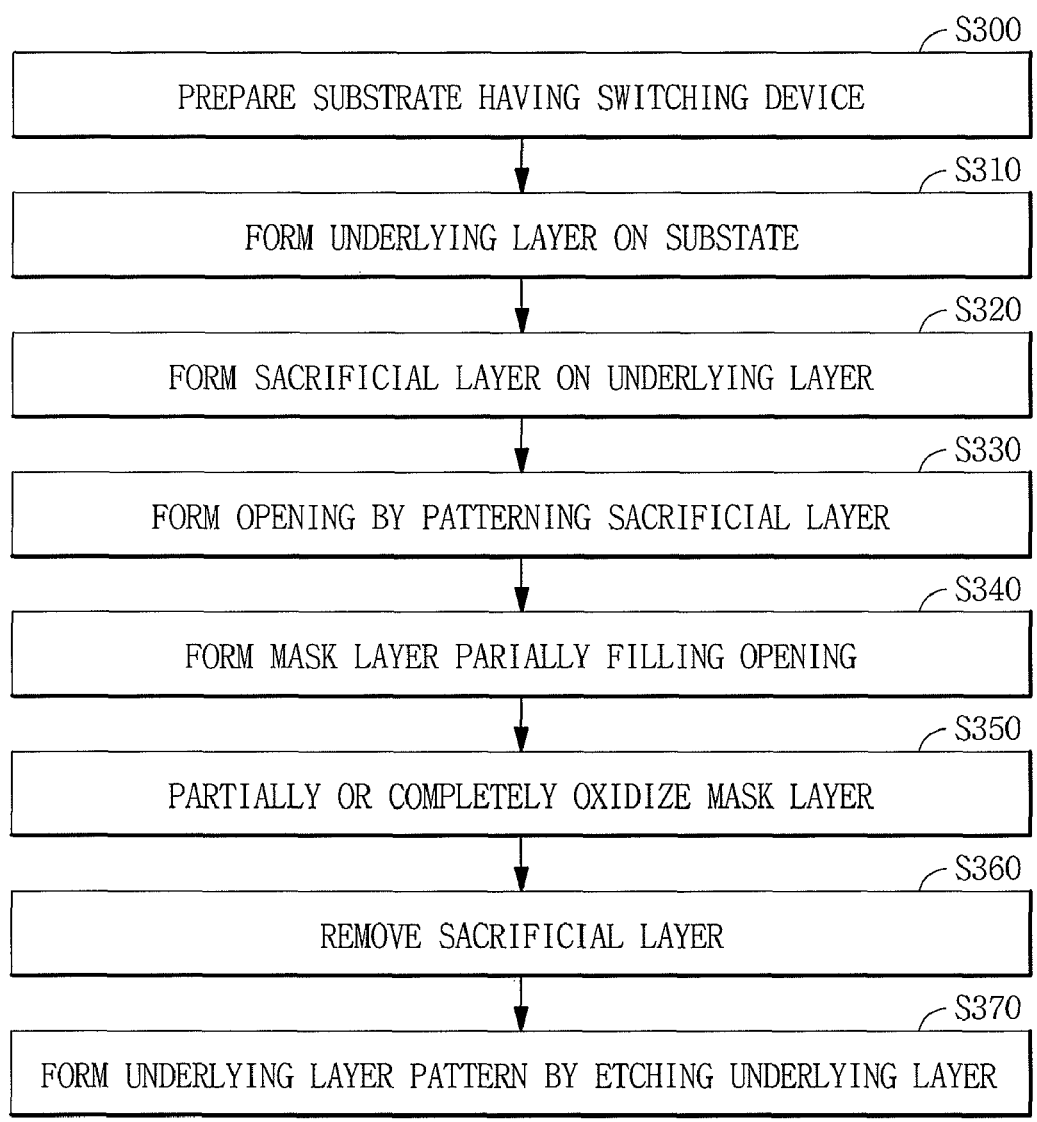

Referring to FIG. 3, similar to the embodiment illustrated in FIG. 1, a substrate having a switching device may be prepared (S300), an underlying layer may be formed on the substrate (S310), and a sacrificial layer may be formed on the underlying layer (S320) and patterned, thereby forming an opening (S330).

A mask layer partially filling the opening may be formed (S340). The mask layer may be formed of a metal layer including a metal material, e.g., tungsten. For example, to form the mask layer, a tungsten layer may be formed on the substrate including the sacrificial layer having the opening, may be planarized by etch-back or chemical-mechanical polishing, and may be partially etched to partially fill the opening.

The mask layer may be partially or completely oxidized (S350). The sacrificial layer may be removed by etching (S360). Subsequently, the underlying layer may be etched using the oxide mask as an etch mask, thereby forming an underlying layer pattern (S370).

Next, a method of fabricating a semiconductor device according to still another embodiment will be described with reference to FIG. 4.

Figure 4:
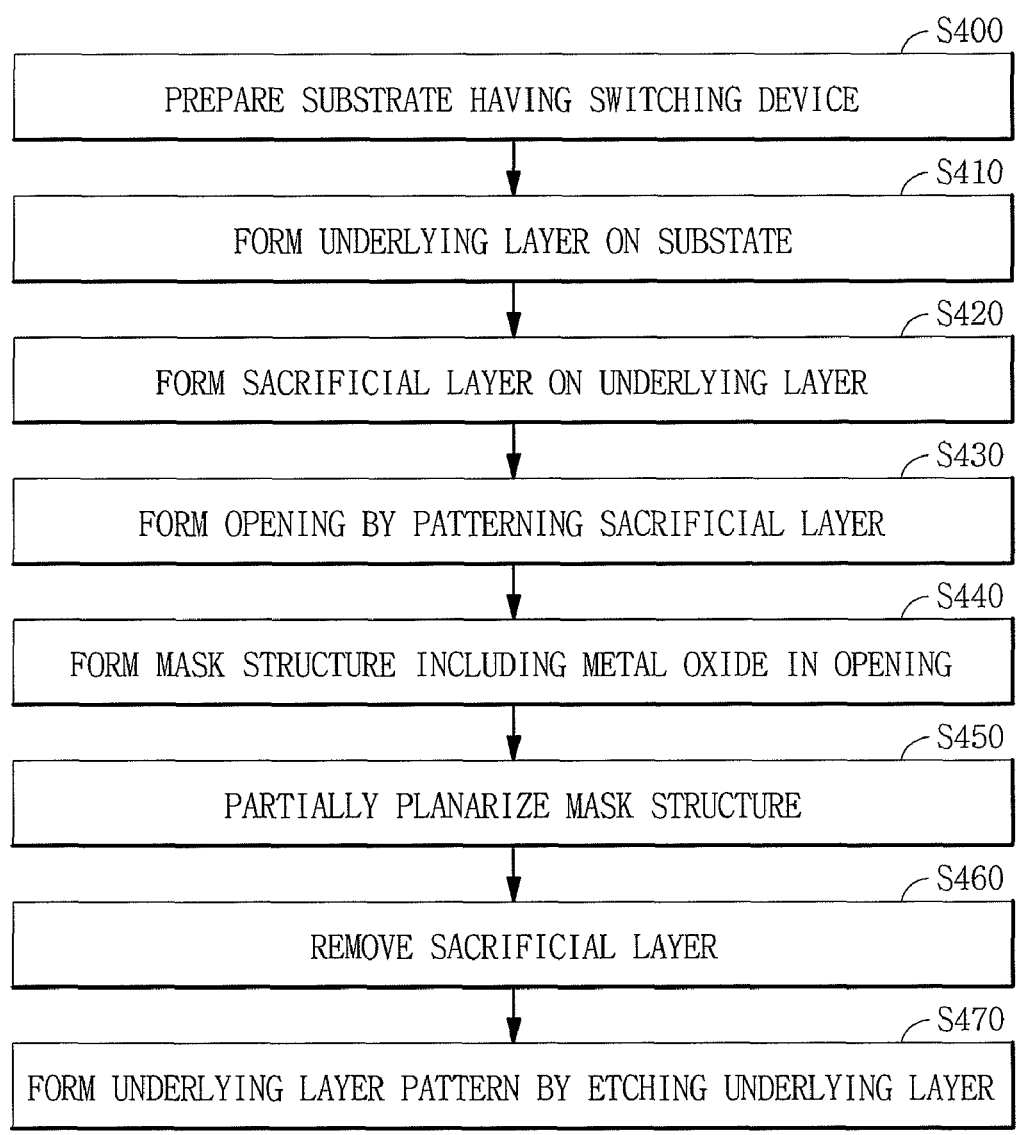

Referring to FIG. 4, similar to the embodiment illustrated in FIG. 1, a substrate having a switching device may be prepared (S400), an underlying layer may be formed on the substrate (S410), and a sacrificial layer may be formed on the underlying layer (S420) and patterned, thereby forming an opening (S430).

A mask structure including a metal oxide may be formed in the opening (S440). The mask structure may be partially planarized (S450). In an implementation, an upper region of the partially planarized mask structure may be formed of, e.g., a metal oxide. The portion formed of the metal oxide may be defined as an oxide mask. The sacrificial layer may be removed (S450). Subsequently, an underlying layer pattern (main pattern) may be formed by etching the underlying layer using the mask structure as an etch mask (S460).

A method of fabricating a semiconductor device will be described in further detail with reference to example embodiments below.

A method of fabricating a semiconductor device according to an example embodiment will be described with reference to FIGS. 5A through 5G. FIGS. 5A to 5G illustrate cross-sectional views of stages in a method of fabricating a semiconductor device according to an embodiment.

Figure 5A:
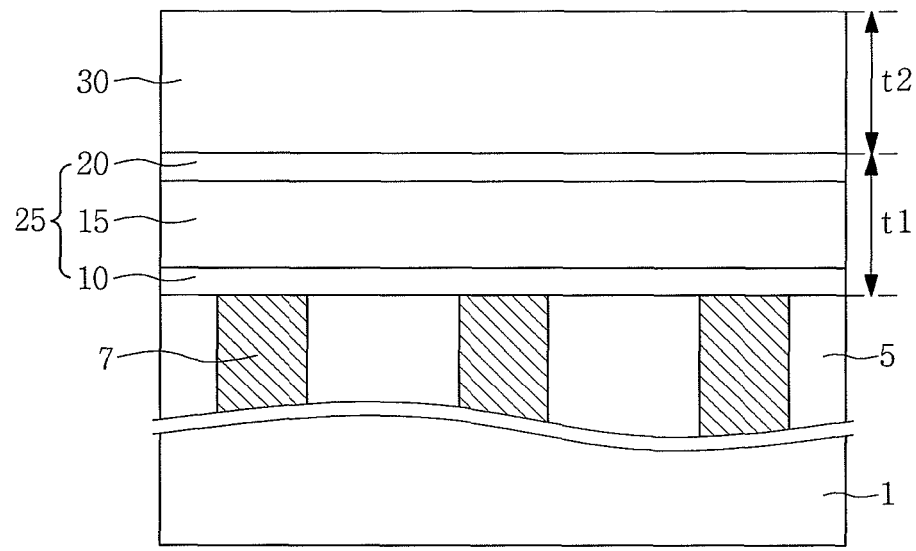
FIGS. 5A through 5G illustrate cross-sectional views of stages in a method of fabricating a semiconductor device according to an embodiment.

Referring to FIG. 5A, a substrate 1 may be prepared or provided. The substrate 1 may be a semiconductor substrate including a switching device. The switching device may be a device, e.g., a transistor or a diode. Such devices, e.g., a transistor and/or a diode, functioning as a switching device, are well known to those of ordinary skill in the art, and thus a detailed description thereof will be omitted.

An interlayer insulating layer 5 may be formed on the substrate 1 having the switching device. The interlayer insulating layer 5 may be formed of an insulating material, e.g., a silicon oxide.

Plugs 7 passing through the interlayer insulating layer 5 may be formed. The plugs 7 may be formed of a conductive material. For example, the plugs 7 may include a conductive material such as polysilicon, tungsten, titanium, tantalum, titanium nitride, and/or tantalum nitride.

The plugs 7 may be electrically connected with the switching device of the substrate 1. For example, when the switching device is a MOS transistor, the plugs 7 may be electrically connected with any one of source and drain regions of the MOS transistor.

An underlying layer 25 having a first height (t1) may be formed on the substrate having the plugs 7. The underlying layer 25 may be a layer to be finally patterned as will be described below. The underlying layer 25 may include, e.g., a data storage layer 15 including a data storage material.

The data storage layer 15 may include a material for storing data of a non-volatile memory device. For example, the data storage layer 15 may be formed as a magnetic tunnel junction (MTJ) structure of an MRAM. For example, the data storage layer 15 may be composed of a plurality of magnetic layers and an insulating non-magnetic layer between the magnetic layers.

In an implementation, the underlying layer 25 may include a lower layer 10 and the data storage layer 15, which may be sequentially stacked.

In another implementation, the underlying layer 25 may include the lower layer 10, the data storage layer 15, and an upper layer 20, which may be sequentially stacked.

When the data storage layer 15 is formed of a data storage material of a non-volatile RAM such as an MRAM, the lower layer 10 may include a conductive material layer for constituting a lower electrode; and the upper layer 20 may include a conductive material layer for constituting an upper electrode. The upper layer 20 may be formed of a conductive capping layer for protecting the data storage layer 15. Each of the lower and upper layers 10 and 20 may be formed in a single or stacked layer structure using a conductive material layer, e.g., an iridium (Ir) layer, a platinum (Pt) layer, an Iridium-oxide (IrO) layer, a titanium nitride (TiN) layer, a titanium aluminum nitride (TiAlN) layer, a ruthenium (Ru) layer, and/or a tantalum nitride (TaN) layer.

A sacrificial layer 30 having a second height (t2) may be formed on the underlying layer 25. The sacrificial layer 30 may be formed of a material layer, e.g., a silicon oxide layer or a silicon nitride layer.

The second height (t2) of the sacrificial layer 30 may be about 1 to about 3 times the first height (t1) of the underlying layer 25. For example, the second height (t2) may be equal to or greater than the first height (t1), or about 3 times or less than the first height (t1).

In an implementation, the second height (t2) of the sacrificial layer 30 may be about 1 to about 1.5 times the first height (t1) of the underlying layer 25. For example, the second height (t2) may be equal to or greater than the first height (t1), or about 2 or 1.5 times or less than the first height (t1).

Figure 5B:
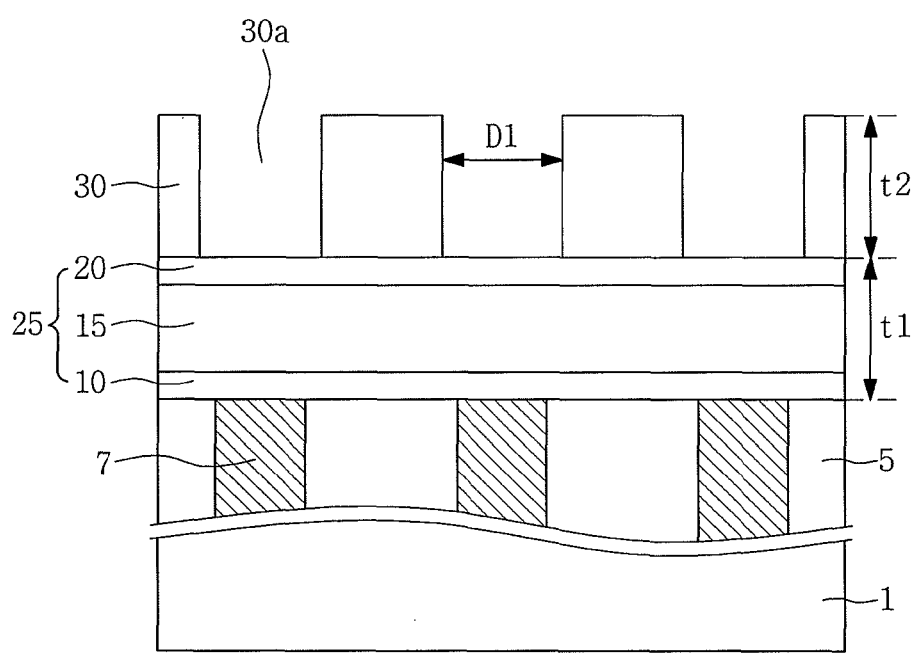

Referring to FIG. 5B, an opening 30a may be formed by patterning the sacrificial layer 30. The opening 30a may expose a predetermined region of the underlying layer 25. The opening 30a may be formed as a hole. However, a shape of the opening is not limited. For example, the opening 30a may have a bar or line shape.

In an implementation, the opening 30a may have a substantially perpendicular sidewall relative to a surface of the underlying layer 25.

The opening 30a may have a first width (D1). The first width (D1) of the opening 30a may be about 0.5 to about 1.5 times the second height (t1) of the sacrificial layer 30.

Figure 5C:
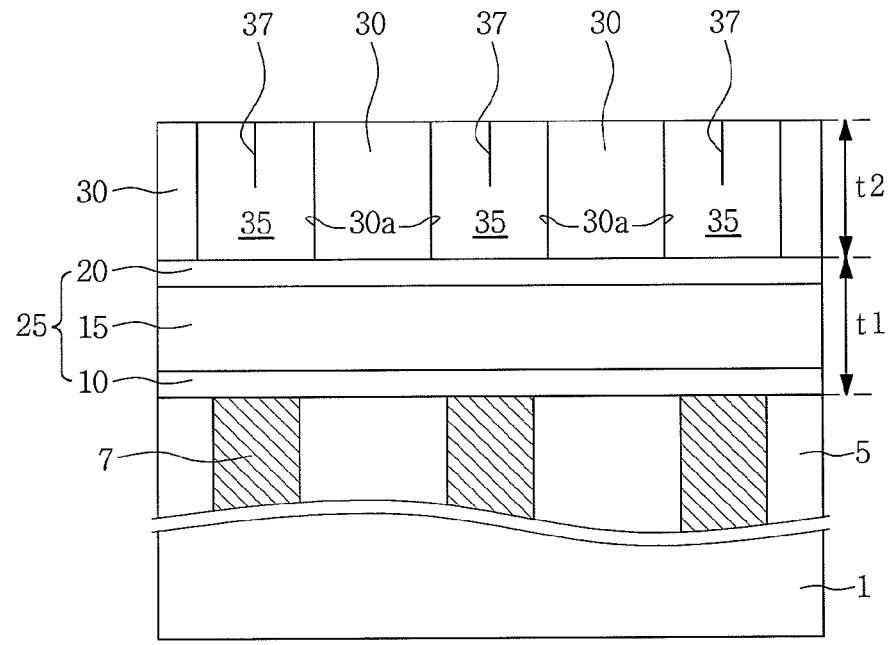

Referring to FIG. 5C, a mask layer 35 may be formed in the opening 30a. The mask layer 35 may be formed of a conductive material layer. For example, the mask layer 35 may be formed of a metal layer such as a tungsten layer. In an implementation, the mask layer 35 may be formed of a material different from the underlying layer 25.

To form the mask layer 35, a conductive material layer (not illustrated) may be formed on the substrate having the opening 30a in the sacrificial layer 30 and planarized until a top surface of the sacrificial layer 30 is exposed. The conductive material layer may be formed by, e.g., physical vapor deposition (PVD) or chemical vapor deposition (CVD). The planarization may be performed by, e.g., chemical-mechanical polishing (CMP). During formation of the mask layer 35, a defect 37, e.g., a seam may be formed or may occur in an upper region of the mask layer 35.

Figure 5D:
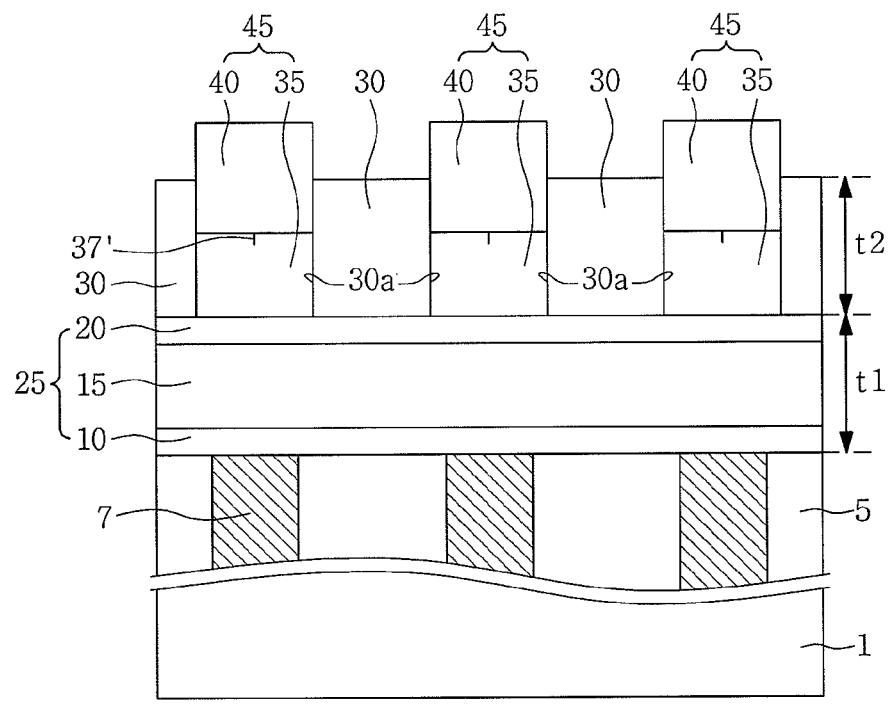

Referring to FIG. 5D, the mask layer 35 may be partially or completely oxidized. Thus, an oxide mask 40 may be formed over the mask layer 35. The oxide mask 40 may have an etch selectivity with respect to the underlying layer 25. The oxide mask 40 may be formed by annealing the mask layer 35. In an implementation, the oxide mask 40 may be formed by, e.g., rapid thermal annealing performed in an ambient including oxygen gas. In another implementation, the oxide mask 40 may be formed by oxidation using, e.g., an oxygen radical, plasma oxidation using plasma, or oxidation in which annealing is performed in a furnace in an oxygen gas ambient.

The annealing process performed on the mask layer 35 may be performed at a temperature that does not degrade the underlying layer 25. For example, when the underlying layer 25 includes a data storage material of an MRAM, the annealing process may be performed at about 400° C. to about 700° C. The annealing process may be performed at an oxidation gas flow rate of about 500 sccm to about 2,000 sccm for about 60 seconds to about 30 minutes.

When the mask layer 30 is formed of a metal layer, e.g., a tungsten layer, the oxide mask 40 may be formed of a metal oxide layer, e.g., a tungsten oxide layer. The oxide mask 40 may be grown from the mask layer 30.

In an implementation, when the mask layer 35 partially remains, the mask layer 35 and the oxide mask 40, which may be sequentially stacked, may be defined as a mask structure or a mask pattern 45. When the mask layer 35 partially remains, the defects 37' may partially remain in the mask layer 35. However, all the defects 37 in the oxide mask 40 may be treated and removed. For example, in the mask pattern 40, no defect, e.g., a seam in a portion in which the oxide mask 40 is located, may remain.

In another implementation, when the oxide mask 40 is formed by completely oxidizing the mask layer 35, the oxide mask 40 may be defined as the mask structure or mask pattern 45.

In a part of the mask pattern 45, a protrusion may be formed, e.g., may extend, from or above the sacrificial layer 30. For example, a part of the oxide mask 40 may be located in the opening 30a, and a remaining part of the oxide mask 40 may project from or above the sacrificial layer 30.

Figure 5E:
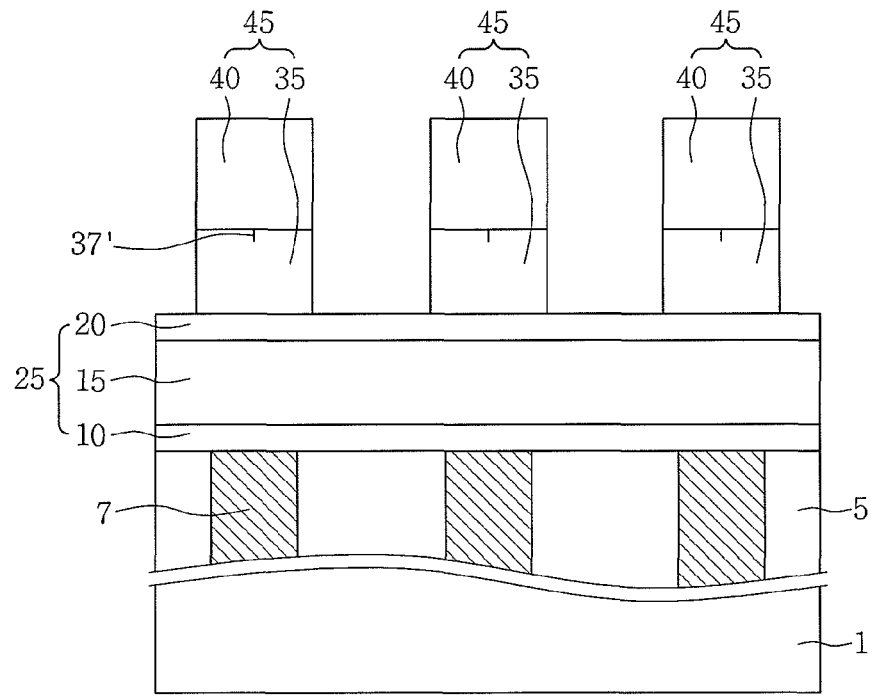

Referring to FIG. 5E, the sacrificial layer 30 may be etched and removed using the mask pattern 45 as an etch mask.

Figure 5F:
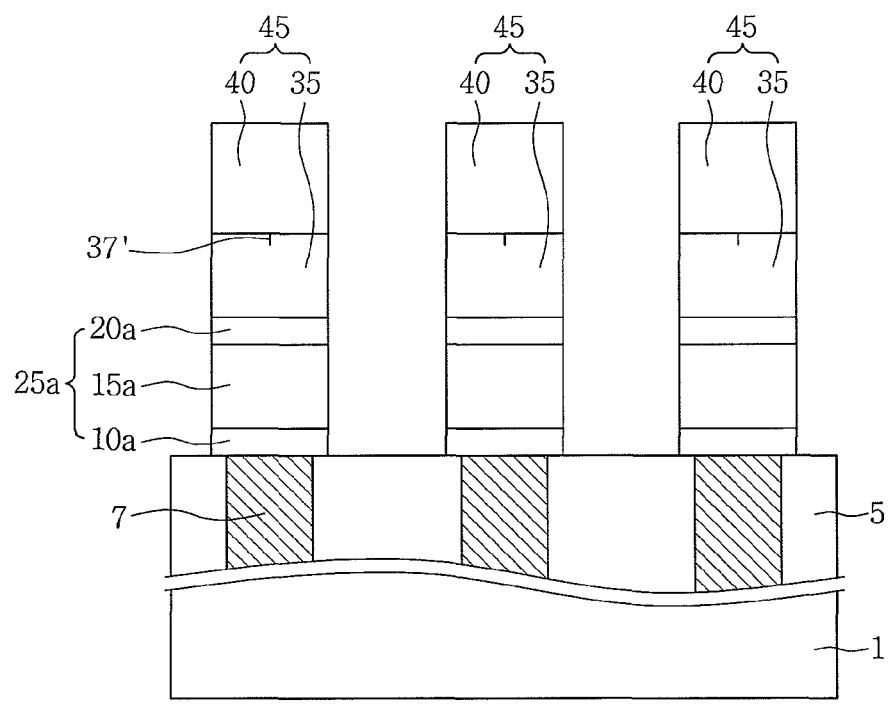

Referring to FIG. 5F, the underlying layer 25 may be etched using the mask pattern 45 as an etch mask, thereby forming an underlying layer pattern 25a. When the underlying layer 25 includes the lower layer 10, the data storage layer 15, and the upper layer 20, which may be sequentially stacked, the underlying layer pattern 25a may include a lower pattern 10a, a data storage pattern 15a, and an upper pattern 20a, which may be sequentially stacked.

The mask pattern 45 may have a sidewall that is substantially perpendicular to a surface of the underlying layer 25. The underlying layer pattern 25a under the mask pattern 45 may also have a substantially perpendicular sidewall, e.g., parallel to the sidewall of the mask pattern 45. Thus, adjacent underlying layer patterns 25a may be spaced apart with a predetermined distance therebetween. For example, an electrical short circuit between the adjacent underlying layer patterns 25a may be prevented due to the space therebetween.

The data storage pattern 15a may be a data storage element of a non-volatile memory device. For example, the data storage pattern 15a may be formed as an MTJ structure of the MRAM. For example, the data storage pattern 15a may include a plurality of magnetic layers and an insulating non-magnetic layer between the magnetic layers. The data storage pattern 15a may be a data storage element of a spin transfer torque MRAM (STT-MRAM). Such an MRAM is widely known, and thus a detailed structure of the data storage pattern 15a will be omitted. In an implementation, the data storage pattern 15a may be formed as a data storage element for various resistance RAMs (RRAMs), not just for the MRAM. For example, the data storage pattern 15a may include a data storage material layer in which a resistance is reversibly changed due to an electric pulse, such as a transition metal oxide layer.

The oxide mask 40 may have a resistance of less than about half of a resistance of the data storage pattern 15a of the underlying layer pattern 25a. In an implementation, the data storage pattern 15a used in the non-volatile memory device may be programmed to "0" in a low resistance state or "1" in a high resistance state. In the non-volatile memory device, to reliably perform write and read operations, the oxide mask 40 may have a resistance value of less than half of the resistance value of the data storage pattern 15a programmed to "0".

Figure 5G:
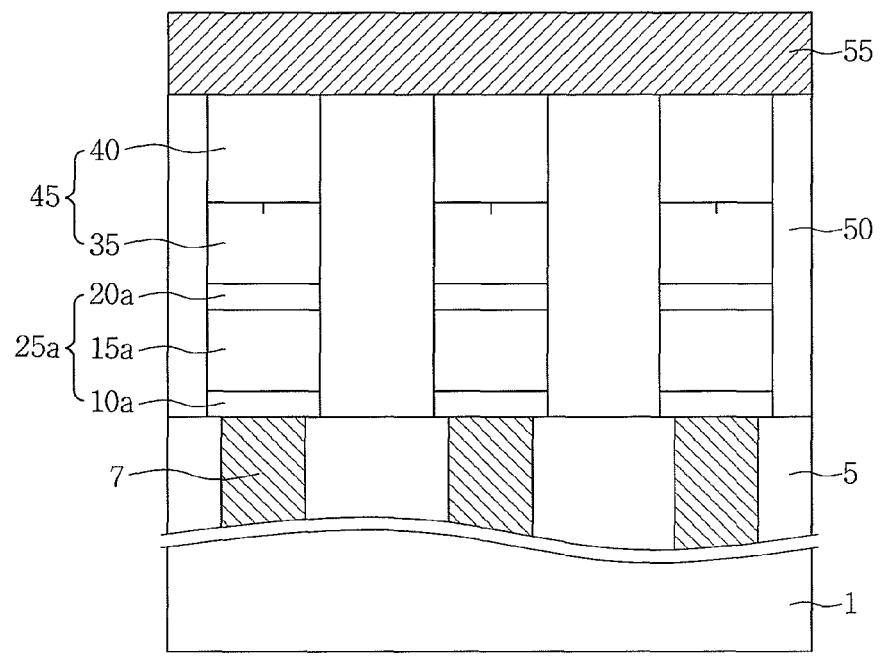

Referring to FIG. 5G, an inter-metal insulating layer 50 may be formed on the substrate 1 having the underlying layer pattern 25a. The inter-metal insulating layer 50 may be formed of, e.g., a silicon oxide layer. The inter-metal insulating layer 50 may have a top surface, which may be planarized to expose a top surface of the mask pattern 45. For example, to form the inter-metal insulating layer 50, an insulating material layer (not illustrated) may be formed on the substrate 1 having the underlying layer pattern 25a, and then planarized until the top surface of the mask pattern 45 is exposed.

A conductive line 55 may be formed on the inter-metal insulating layer 50. The conductive line 55 may be in electrical contact with the mask pattern 45. The conductive line 55 may be formed of a metal material, e.g., tungsten, aluminum, and/or copper.

Figure 6:
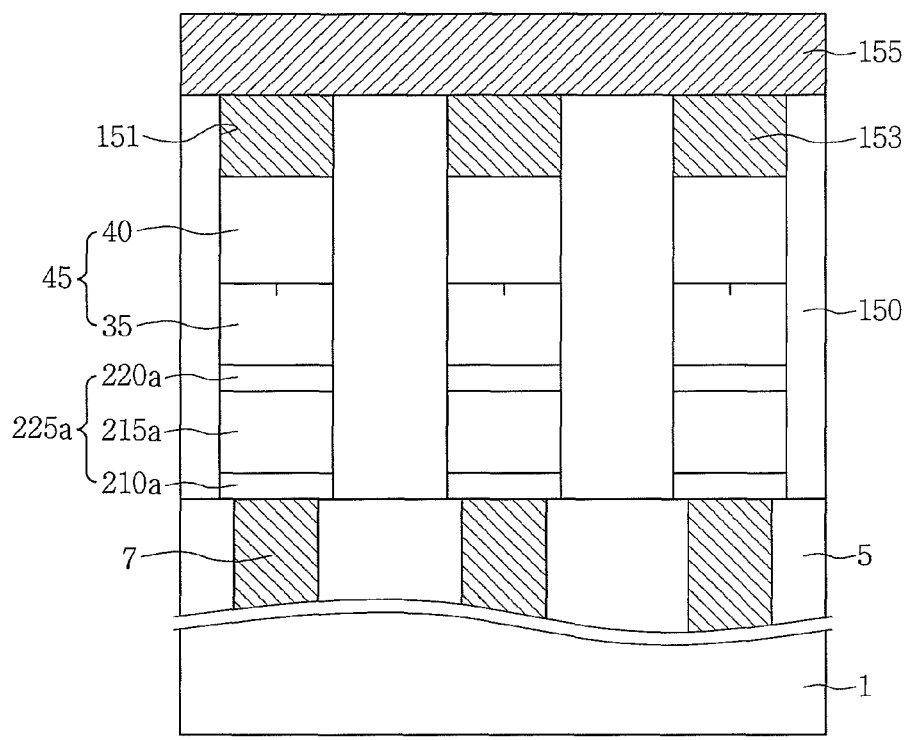
FIG. 6 illustrates a cross-sectional view of a stage in a method of fabricating a semiconductor device according to another embodiment.

FIG. 6 illustrates a cross-sectional view of a stage in a method of fabricating a semiconductor device according to another embodiment. In an implementation, the process of forming the conductive line 55 illustrated in FIG. 5G may be modified as described in FIG. 6. Referring to FIG. 6, an inter-metal insulating layer 150 covering the underlying layer pattern 25a may be formed on the substrate 1 having the underlying layer pattern 25a thereon. The inter-metal insulating layer 150 may be formed of, e.g., a silicon oxide layer. A hole 151 passing through the inter-metal insulating layer 150 and exposing the mask pattern 45 may be formed. Subsequently, an upper plug 153 may be formed. The upper plug 153 may fill the hole 151 and may be in electrical contact with the mask pattern 45. A conductive line 155 in electrical contact with the upper plug 153 may be formed on the inter-metal insulating layer 150.

To form the upper plug 153 and the conductive line 155, a conductive material layer (not illustrated) filling the hole 151 may be formed on the substrate 1 having the hole 151 and then patterned. In an implementation, to form the upper plug 153 and the conductive line 155, the hole 151 passing through the inter-metal insulating layer 150 and exposing the mask pattern 45 and a trench crossing the hole 151 may be formed using a dual damascene process, and a conductive material layer (not illustrated) filling the hole 151 and the trench may be formed. In another implementation, to form the upper plug 153 and the conductive line 155, after the upper plug 153 filling the hole 151 is formed, a conductive material layer (not illustrated) covering the upper plug 153 may be formed and then patterned.

The embodiments are not limited to those described above and may be actualized in different forms. Hereinafter, example embodiments actualized in different forms from the above-described embodiment will be described.

Figure 7A:
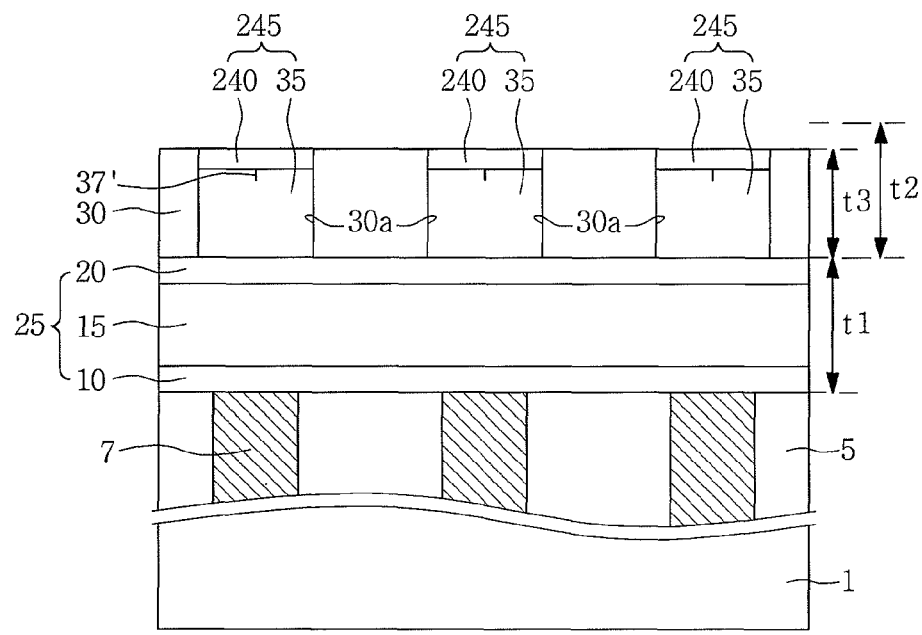
FIGS. 7A and 7B illustrate cross-sectional views of stages in a method of fabricating a semiconductor device according to yet another embodiment.
Figure 7B:
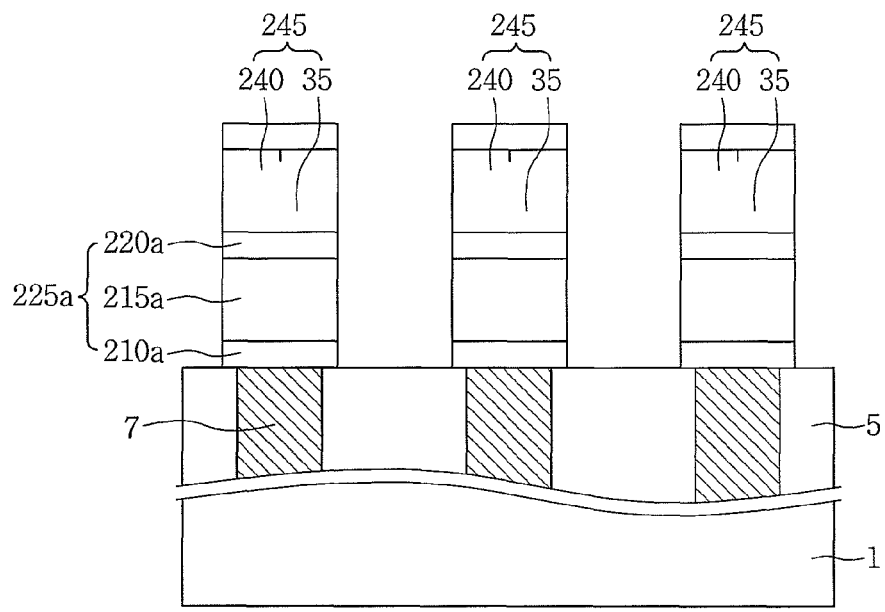

An example embodiment actualized in a different form will be described with reference to FIGS. 7A and 7B. FIGS. 7A and 7B illustrate cross-sectional views of stages in a method of fabricating a semiconductor device according to yet another embodiment.

Referring to FIG. 7A, a substrate 1 may be prepared similar to the embodiment illustrated in FIGS. 5A through 5D. For example, a substrate 1 having the oxide mask 40 similar to the embodiment illustrated in FIG. 5D may be prepared. An oxide mask 240 having a decreased thickness may be formed by performing a process of decreasing a thickness of the oxide mask 40 of FIG. 5D. For example, the oxide mask 40 of FIG. 5D may be partially planarized, thereby forming an oxide mask 240 having a decreased thickness. The partial planarization may be performed using, e.g., CMP or etch-back. As described above, a degree of decreasing the thickness of the oxide mask 40 may be determined by total resistance characteristics and thickness of the oxide mask 40. For example, when the thickness of the mask pattern 45 including the oxide mask 40 is about 3 times greater than that of the underlying layer 25, the process of decreasing the thickness of the oxide mask 40 may be performed to form a mask pattern 245 to have a thickness of about 3 times less than that of the underlying layer 25. As a result, the thickness of the mask pattern 245 may be about 1 to about 3 times the thickness of the underlying layer 25.

The mask layer 35 and the oxide mask 240, which may be sequentially stacked, may be defined as a mask structure or the mask pattern 245.

In an implementation, during the partial planarization, a thickness of the sacrificial layer 30 may be decreased to a third thickness (t3), which may be less than the second thickness (t2).

Referring to FIG. 7B, similar to the embodiment illustrated in FIGS. 5E and 5F, after the sacrificial layer 30 is removed using the mask pattern 245 as an etch mask, the underlying layer 25 may be etched. As a result, an underlying layer pattern 225a may be formed under the mask pattern 245. The underlying layer pattern 225a may include a lower pattern 210a, a data storage pattern 215a, and an upper pattern 220a, which may be sequentially stacked as described in FIG. 5F.

Figure 8A:
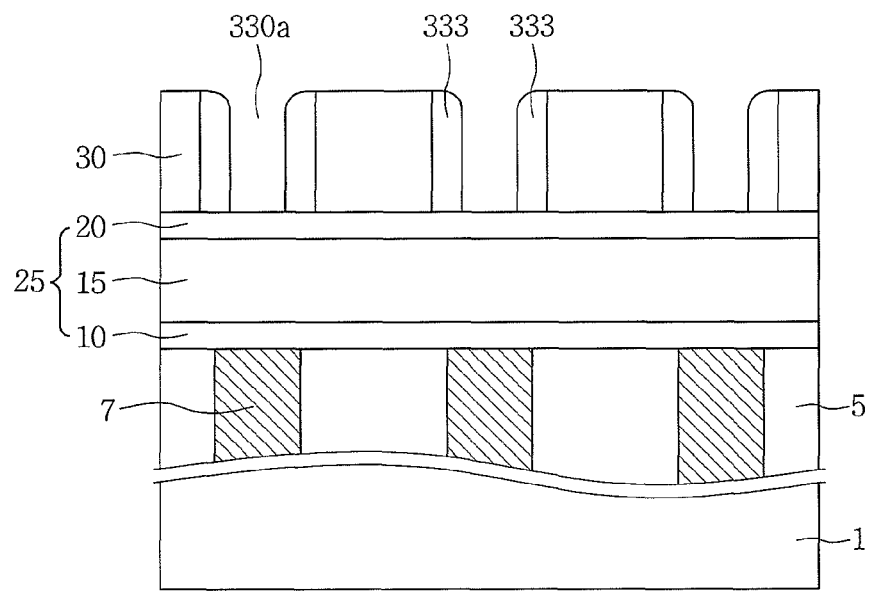
FIGS. 8A through 8C illustrate cross-sectional views of stages in a method of fabricating a semiconductor device according to still another embodiment.
Figure 8B:
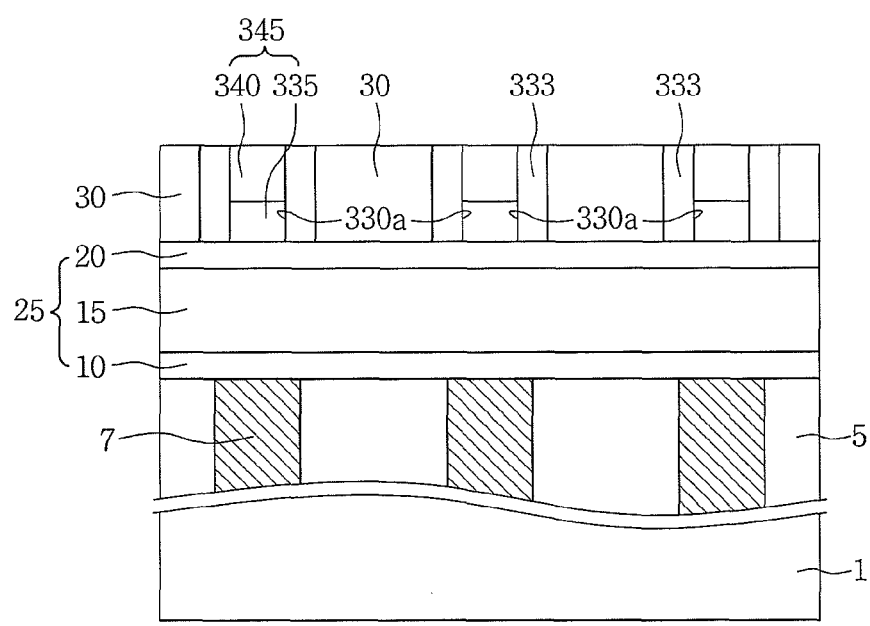
Figure 8C:
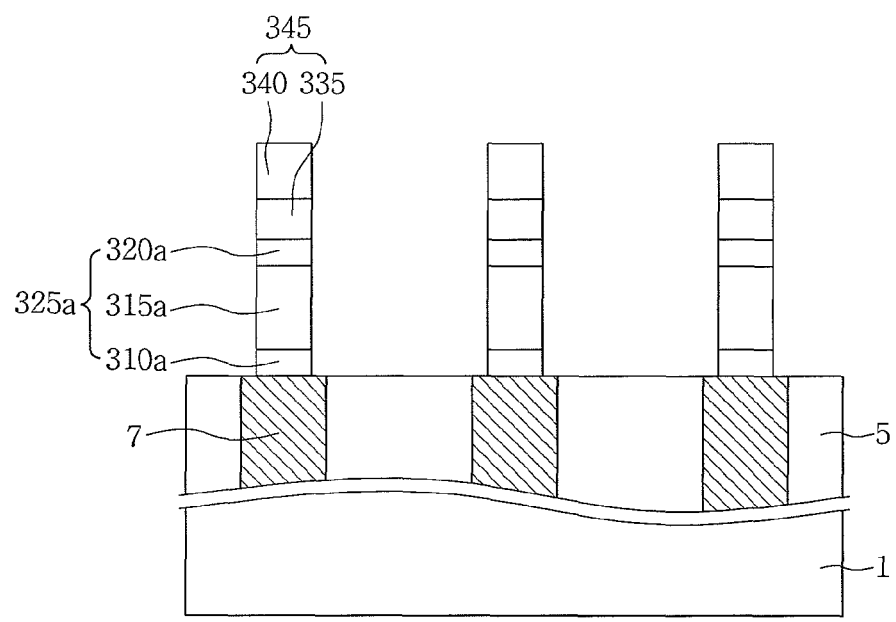

Next, an embodiment actualized in another form will be described with reference to FIGS. 8A through 8C. FIGS. 8A through 8C illustrate cross-sectional views of stages in a method of fabricating a semiconductor device according to still another embodiment.

Referring to FIG. 8A, a substrate 1 similar to the embodiment illustrated in FIGS. 5A and 5B may be prepared or provided. For example, the substrate 1 having the sacrificial layer having opening 30a similar to the embodiment illustrated in FIG. 5B may be prepared. Subsequently, a spacer 333 may be formed on a sidewall of the opening 30a. To form the spacer 333, a spacer layer (not illustrated) may be formed on the substrate 1 including the sacrificial layer 30 having the opening 30a and anisotropically etched. Due to the spacer 333, an opening 330a having a width less than the width of the opening 30a illustrated in FIG. 5B may be formed.

The spacer 333 may be formed of a material having the same etch selectivity as the sacrificial layer 30. For example, the spacer 333 may be formed of the same material as the sacrificial layer 30.

Referring to FIG. 8B, a mask layer 335 may be formed in the opening 330a and may be partially or completely oxidized, thereby forming an oxide mask 340. The mask layer 335 and the oxide mask 340 may constitute a mask pattern 345. The oxide mask 340 may be formed of a metal oxide, e.g., a tungsten oxide.

In an implementation, similar to the embodiment illustrated in FIG. 7A, a thickness of the oxide mask 340 may be decreased. For example, the oxide mask 340 may be partially planarized. In another implementation, the partial planarization for decreasing the thickness of the oxide mask 340 may be omitted.

Referring to FIG. 8C, the sacrificial layer 30 and the spacer 333 may be etched and removed using the mask pattern 345 as an etch mask. Subsequently, the underlying layer 25 may be etched using the mask pattern 345 as an etch mask, thereby forming an underlying layer pattern 325a. The underlying layer pattern 325a may include a lower pattern 310a, a data storage pattern 315a, and an upper pattern 320a, which may be sequentially stacked. The underlying layer pattern 325a may be in electrical contact with the plug 7.

The data storage pattern 315a formed using the spacer 333 may have a width narrower than a width the data storage pattern 15a of FIG. 5F. Thus, an interfacial area between the data storage pattern 15a and a material layer in contact therewith may be minimized so that a memory device may be realized even at a lower power level.

Figure 9A:
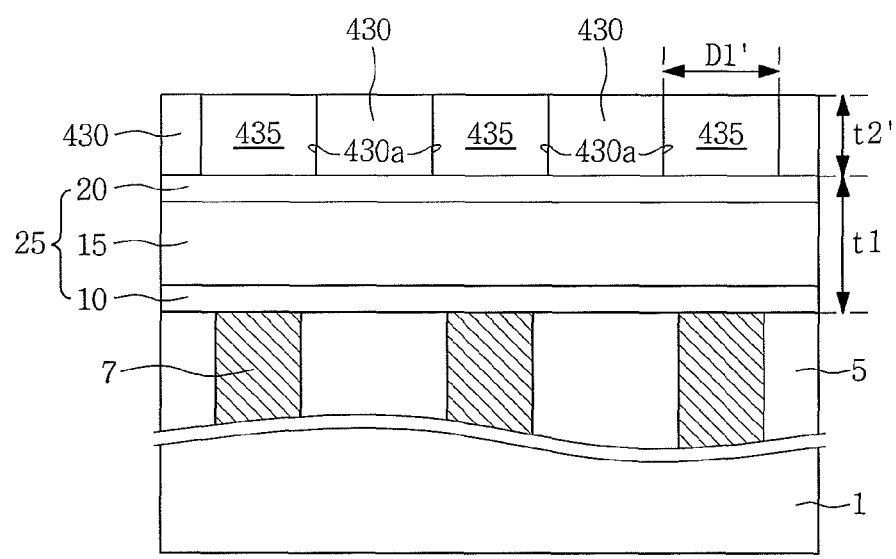
FIGS. 9A through 9C illustrate cross-sectional views of stages in a method of fabricating a semiconductor device according to still another embodiment.
Figure 9B:
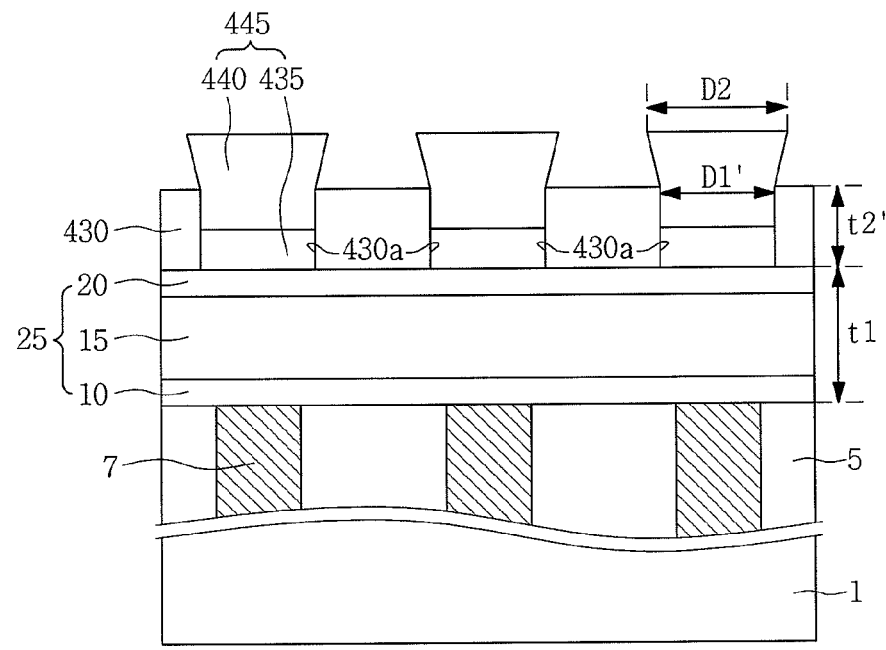
Figure 9C:
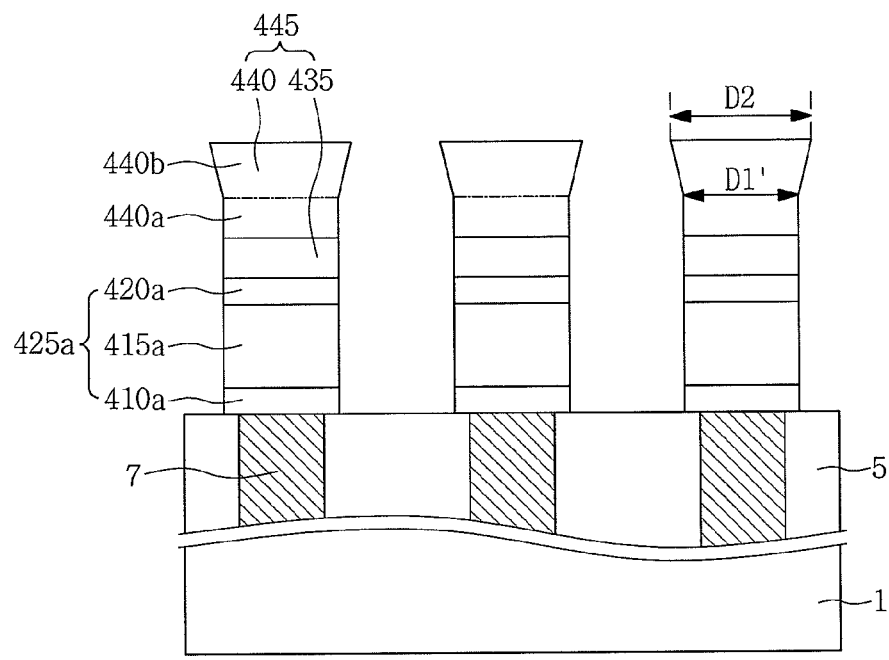

Next, an embodiment actualized in still another form will be described with reference to FIGS. 9A through 9C. FIGS. 9A through 9C illustrate cross-sectional views of stages in a method of fabricating a semiconductor device according to still another embodiment.

Referring to FIG. 9A, a substrate 1 having an underlying layer 25 may be prepared similar to the embodiment illustrated in FIG. 5A. A sacrificial layer 430 may be formed on the underlying layer 25. The sacrificial layer 430 may be patterned, thereby forming an opening 430a exposing a predetermined region of the underlying layer 25 and having a first width (D1').

Subsequently, a mask material layer (not illustrated) may be formed on the substrate 1 including the sacrificial layer 430 having the opening 430a and then planarized. As a result, a mask layer 435 may be formed in the opening 430a. The mask layer 435 may be formed of a metal layer, e.g., a tungsten layer.

Referring to FIG. 9B, an oxide mask 440 may be formed by performing a process of partially or completely oxidizing the mask layer 435. A portion of the oxide mask 440 in the opening 430a may have the first width (D1'), which may be the same as the width (D1') of the opening 430a. A portion of the oxide mask 440 projecting from or above the sacrificial layer 430 may have a second width (D2), which may be greater than the first width (D1') of the opening 430a.

The portion of the oxide mask 440 projecting from or above the sacrificial layer 430 may include a portion gradually increased in width from a bottom to a top thereof. For example, the portion of the oxide mask 440 extending above the sacrificial layer 430 may have a slanted sidewall.

The mask layer 435 and the oxide mask 440, which may be sequentially stacked, may be defined as a mask structure or a mask pattern 445. In an implementation, when the oxide mask 440 is formed by completely oxidizing the mask layer 430, the mask pattern 445 may be composed of the oxide mask 440.

The oxidation process for forming the oxide mask 440 may be performed at about 400° C. to about 700° C. at an oxidation gas flow rate of about 1,000 sccm to about 2,000 sccm for about 60 seconds to about 30 minutes. The oxide mask 440 may include a portion having the first width (D1') and a portion having the second width (D2). As the temperature for the oxidation process becomes higher and an amount of the oxidation gas supplied becomes greater, a dimension of the second width (D2) may be increased. Accordingly, the thickness and width of the oxide mask 440 may be increased as the processing time is increased, e.g., as the processing progresses.

Referring to FIG. 9C, the sacrificial layer 430 may be etched and removed using the mask pattern 445 as an etch mask. Subsequently, the underlying layer 25 may be etched using the mask pattern 445 as an etch mask, thereby forming an underlying layer pattern 425a. The underlying layer pattern 425a may have a substantially perpendicular sidewall with respect to a surface of the interlayer insulating layer 5. The mask pattern 445 may have a lower region having a first width (D1'), which may be relatively less than a width of an upper region thereof. The underlying layer pattern 425a may be formed by etching the underlying layer 25 along the sidewall of the lower region of the mask pattern 445. Thus, the width of the underlying layer pattern 425a may be substantially the same as the first width (D1') of the lower region of the mask pattern 445. The sidewall of the lower region of the mask pattern 445 may be substantially parallel to the sidewall of the underlying layer pattern 425a, e.g., perpendicular to a surface of the interlayer insulating layer 5.

The underlying layer pattern 425a may include a lower pattern 410a, a data storage pattern 415a, and an upper pattern 420a, which may be sequentially stacked. The underlying layer pattern 425a may be in electrical contact with the plug 7.

Subsequently, conductive lines 55 and 155 as illustrated in FIG. 5G or 6 may be formed on the substrate 1 having the underlying layer pattern 425a.

Figure 10A:
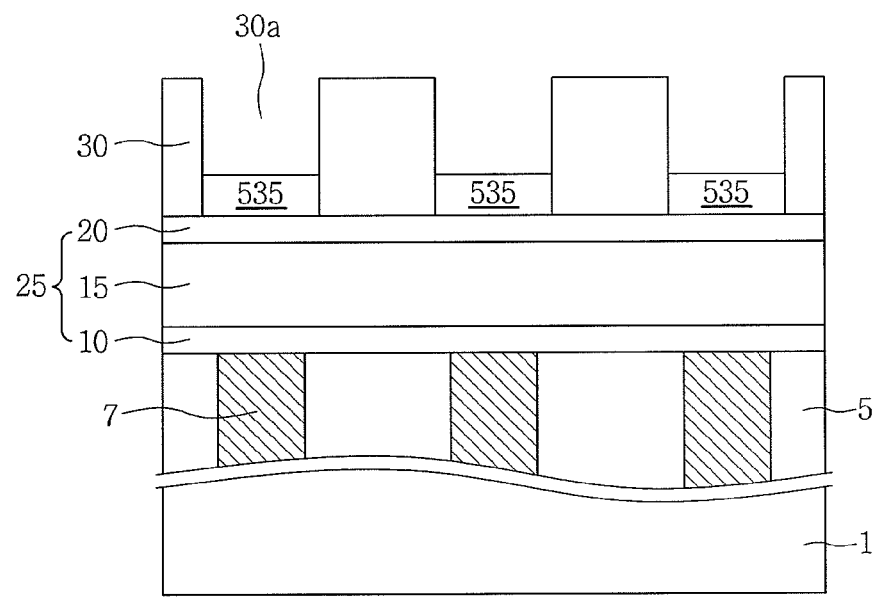
FIGS. 10A through 10C illustrate cross-sectional views of stages in a method of fabricating a semiconductor device according to still another embodiment.
Figure 10B:
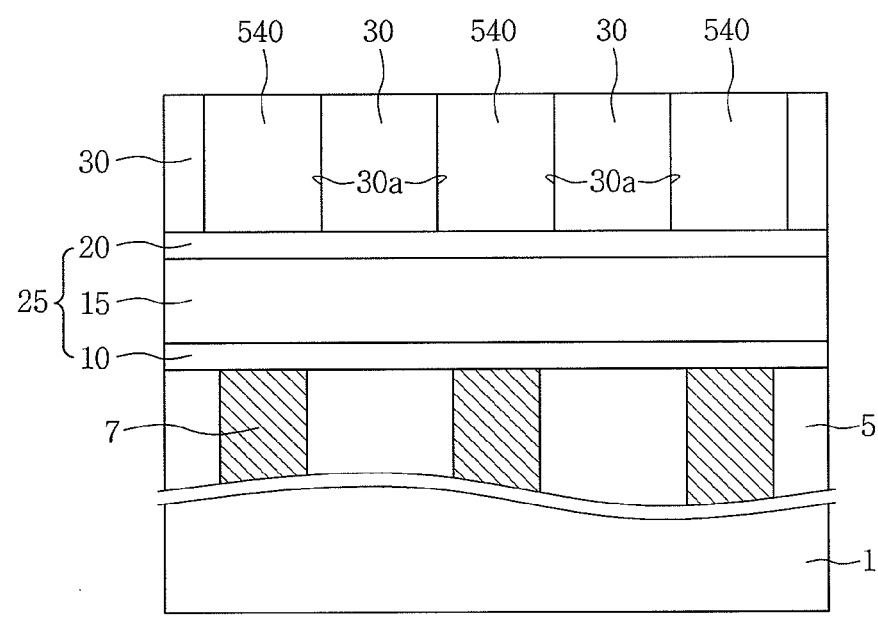
Figure 10C:
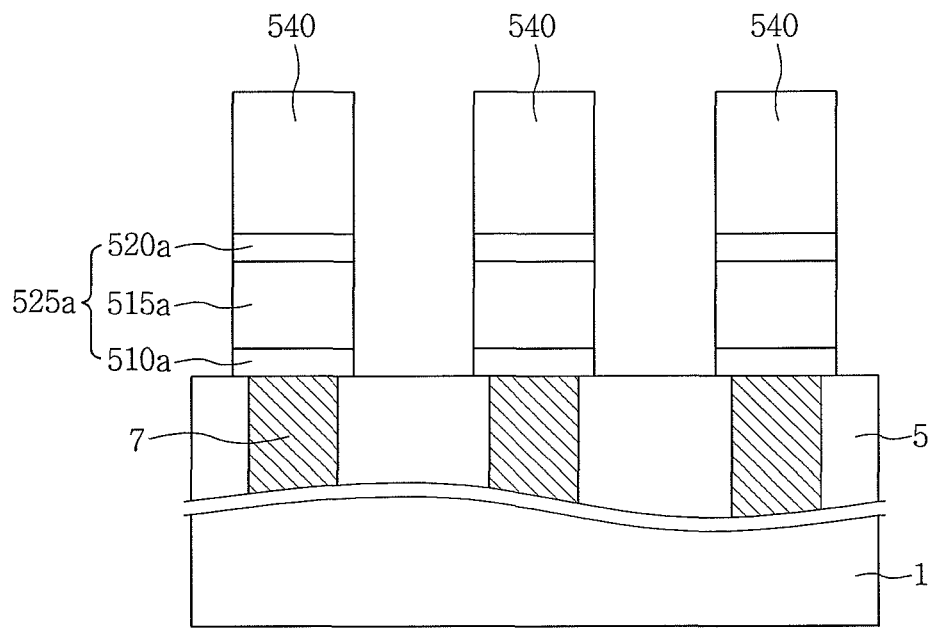

An embodiment actualized in yet another form will be described with reference to FIGS. 10A through 10C. FIGS. 10A through 10C illustrate cross-sectional views of stages in a method of fabricating a semiconductor device according to still another embodiment.

Referring to FIG. 10A, a substrate 1 having the sacrificial layer 30 with the opening 30a similar to the embodiment illustrated in FIGS. 5A and 5B may be prepared. Subsequently, a mask layer 535 partially filling the opening 30a may be formed. The mask layer 535 may be formed of a metal layer, e.g., a tungsten layer. To form the mask layer 535, a mask material layer (not illustrated) may be formed on the substrate 1 including the sacrificial layer 530 having the opening 30a and then etched. In an implementation, to form the mask layer 535, a mask material layer (not illustrated) may be formed on the substrate 1 including the sacrificial layer 530 having the opening 30a, planarized, and etched.

Referring to FIG. 10B, an oxide mask 540 may be formed by oxidizing the mask layer 535. The oxide mask 540 may be formed in the opening 30a. The oxide mask 540 may be defined as a mask structure or a mask pattern.

In an implementation, the mask layer 535 may be completely oxidized, thereby forming the oxide mask 440. In another implementation, the mask layer 535 may be only partially oxidized. For example, although not shown in FIG. 10B, a part of the mask layer 535 may remain under the oxide mask 540.

In an implementation, similar to the embodiment illustrated in FIG. 7A, the oxide mask 540 may be partially planarized.

In another implementation, similar to the embodiment illustrated in FIG. 8A, after a spacer is formed on a sidewall of the opening 30a, the mask layer 535 may be formed in the opening 30a.

Referring to FIG. 10C, the sacrificial layer 30 may be etched and removed using the oxide mask 540 as an etch mask. Subsequently, the underlying layer 25 may be etched using the oxide mask 540 as an etch mask, thereby forming an underlying layer pattern 525a.

The underlying layer pattern 525a may include a lower pattern 510a, a data storage pattern 515a and an upper pattern 520a, which may be sequentially stacked. The underlying layer pattern 525a may be in electrical contact with the plug 7.

Subsequently, conductive lines 55 and 155 may be formed on the substrate having the underlying layer pattern 525a similar to the embodiment illustrated in FIG. 5G or 6.

Figure 11:
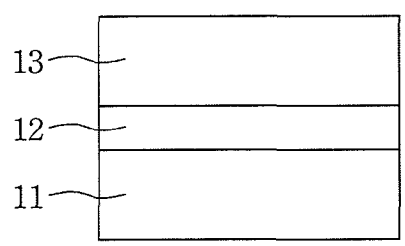
FIG. 11 illustrates a cross-sectional view of a data storage pattern of a semiconductor device according to an embodiment.

FIG. 11 illustrates a cross-sectional view of a data storage pattern of a semiconductor device according to an embodiment. The data storage patterns 15a, 215a, 315a, 415a, and 515a described above may have an MTJ structure of an MRAM. For example, the data storage patterns 15a, 215a, 315a, 415a and 515a described above may include a first layer 11, a tunnel insulating layer 12, and a second layer 13, as described in FIG. 11. Each of the first and second layers 11 and 13 may be formed in a single or multiple layer structure. One of the first and second layers 11 and 13 may be provided as a fixed layer of a specific polarity; and the other of the first and second layers 11 and 13 may be provided as a free layer that may be changed in polarity in response to an external current or magnetic field. According to the change in polarity of the free layer, the data storage patterns 15a, 215a, 315a, 415a and 515a may be changed in resistance value.

Next, semiconductor devices having the underlying layer patterns, which are patterned using the mask patterns, will be described.

Figure 12:
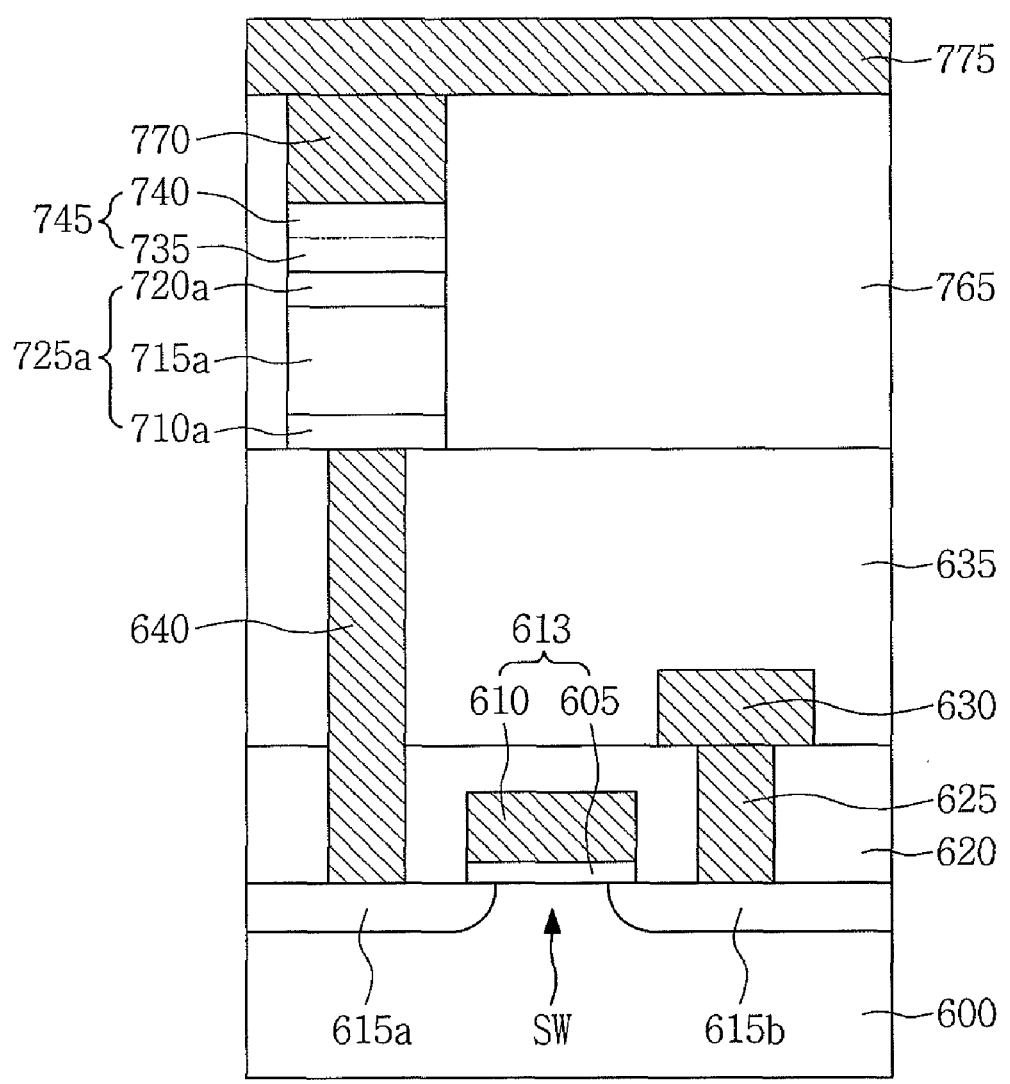
FIG. 12 illustrates a cross-sectional view of a semiconductor device according to an embodiment.

First, a semiconductor device according to an example embodiment will be described with reference to FIG. 12. FIG. 12 illustrates a cross-sectional view of a semiconductor device according to an embodiment.

Referring to FIG. 12, a substrate 600 may be provided. The substrate 600 may be a semiconductor substrate including a semiconductor material. A switching device SW may be provided in the substrate 600. The switching device SW may be, e.g., a MOS transistor. For example, the switching device SW may be a MOS transistor including a gate pattern 613 on the substrate 600 and source and drain regions 615a and 615b in the substrate 600 on both sides of the gate pattern 613. The gate pattern 613 may include a gate dielectric layer 605 and a gate electrode 610, which may be sequentially stacked on an active region of the substrate 600. The gate electrode 610 may be on the active region of the substrate 600 and may extend onto a field region to serve as a word line. The gate dielectric layer 605 may be formed of, e.g., a silicon oxide layer and/or a high-k dielectric layer. The high-k dielectric layer may be defined as a dielectric having a higher dielectric constant than a silicon oxide layer.

A first interlayer insulating layer 620 may be provided on the substrate 600 having the switching device SW. A first conductive line 630 may be provided on the first interlayer insulating layer 620. A conductive plug 625 may be provided between one of the source and drain regions 615a and 615b and the first conductive line 630. Thus, a selected one of the source and drain regions 615a and 615b may be in electrical contact with the conductive line 630 through the conductive plug 625.

When the semiconductor device according to the embodiments is an MRAM, the first conductive line 630 may be defined as a source line.

A second interlayer insulating layer 635 may be provided on the substrate 600 having the first conductive line 630. A plug structure 640 passing through the first and second interlayer insulating layers 620 and 635 and in electrical contact with one of the source and drain regions 615a and 615b may be provided. The plug structure 640 may be formed of a conductive material layer, e.g., a polysilicon layer, a tungsten layer, a titanium layer, a tantalum layer, a titanium nitride layer, a tantalum nitride layer, and/or a tungsten oxide layer.

An underlying layer pattern 725a corresponding to the underlying layer patterns 25a, 225a, 325a, 425a, and 525a described above may be provided on the second interlayer insulating layer 635. The underlying layer pattern 725a may include a lower pattern 710a, a data storage pattern 715a, and an upper pattern 720a, which may be sequentially stacked. The underlying layer pattern 725a may be in electrical contact with the plug structure 640.

The data storage pattern 715a may be a data storage element of a non-volatile memory device. The data storage pattern 715a may be formed as an MTJ structure of the MRAM. For example, the data storage pattern 715a may be composed of a plurality of magnetic layers and an insulating non-magnetic layer disposed between the magnetic layers. The data storage pattern 715a may be a data storage element of a spin transfer torque MRAM (STT-MRAM). Since such an MRAM has been widely known, a detailed structure of the data storage pattern 715a will be omitted.

The data storage pattern 715a may be a data storage element for various RRAMs, and is not limited to the MRAM. For example, the data storage pattern 715a may include a data storage material layer reversibly changed in resistance in response to an electric pulse, such as a transition metal oxide layer.

A conductive mask pattern 745 may be provided on the underlying layer pattern 725a. The mask pattern 745 may correspond to one of the mask pattern 45 of FIG. 5F, the mask pattern 245 of FIG. 7B, the mask pattern 345 of FIG. 8C, and the mask pattern 540 of FIG. 10C. The mask pattern 745 may include a mask layer 735 and an oxide mask 749, which may be sequentially stacked. The mask layer 735 may be formed of a metal material, e.g., a tungsten layer, and the oxide mask 740 may be formed of a metal oxide, e.g., a tungsten oxide.

In an implementation, the mask layer 735 may be omitted, and the mask pattern 745 may be composed of the oxide mask 740. In another implementation, the mask pattern 745 may be composed of the mask layer 735 and the oxide mask 740, which may be sequentially stacked.

An inter-metal insulating layer 765 surrounding sidewalls of the underlying layer pattern 725a and the mask pattern 745 may be provided. A second conductive line 775 may be provided on the inter-metal insulating layer 765.

In an implementation, an upper plug 770 interposed between the second conductive line 775 and the mask pattern 745 may be provided. In another implementation, without the upper plug 770, the second conductive line 775 may be directly in electrical contact with the mask pattern 745.

Figure 13:
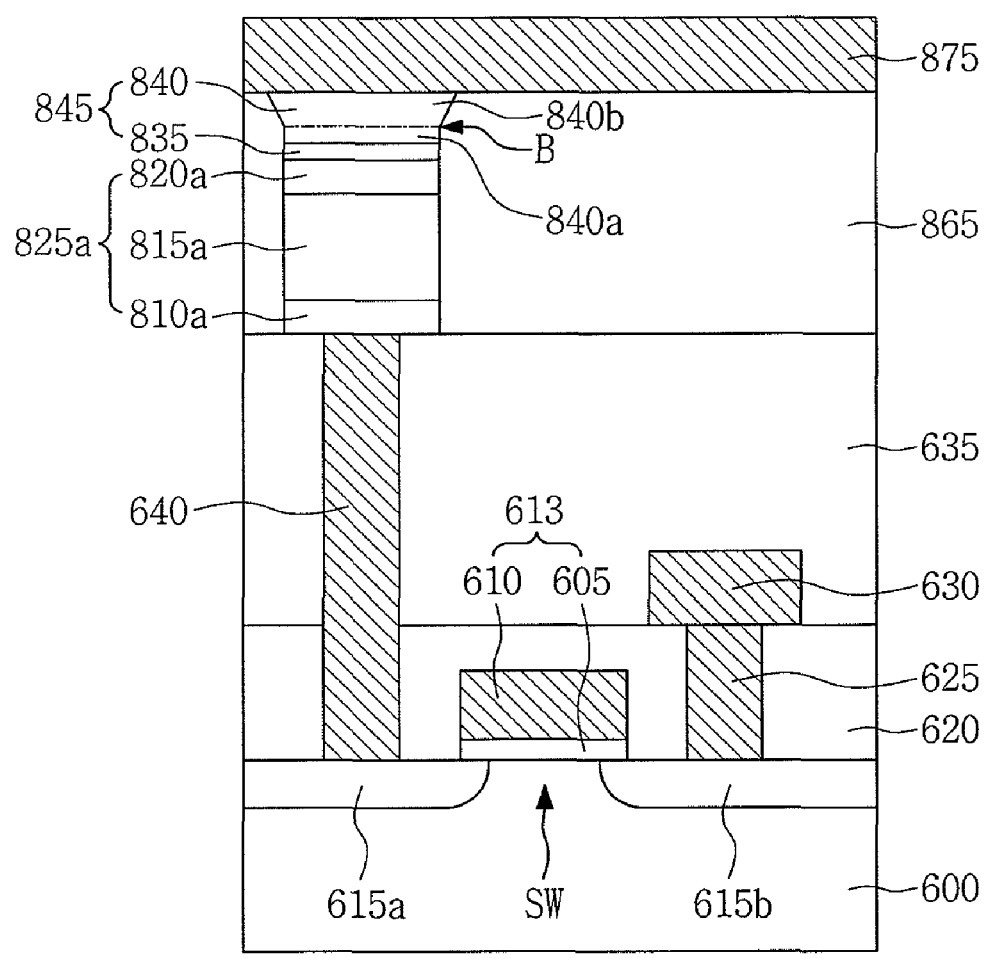
FIG. 13 illustrates a cross-sectional view of a semiconductor device according to another embodiment.

A semiconductor device according to another example embodiment will be described with reference to FIG. 13. FIG. 13 illustrates a cross-sectional view of a semiconductor device according to another embodiment.

Referring to FIG. 13, a substrate 600 having the switching device SW, the interlayer insulating layers 620 and 635, and the plug structure 640 may be prepared as described above with respect to FIG. 12. An underlying layer pattern 825a corresponding to the underlying layer patterns 25a, 225a, 325a, 425a, and 525a described above may be provided on the second interlayer insulating layer 635. The underlying layer pattern 825a may include a lower pattern 810a, a data storage pattern 815a, and an upper pattern 820a, which may be sequentially stacked. The underlying layer pattern 825a may be in electrical contact with the plug structure 640.

A conductive mask pattern 845 may be provided on the underlying layer pattern 825a. The mask pattern 845 may correspond to the mask pattern 445 of FIG. 9C.

In an implementation, the mask pattern 845 may be formed of an oxide mask 840. In another implementation, the mask pattern 445 may be formed of a mask layer 835 and the oxide mask 840, which may be sequentially stacked.

The oxide mask 840 of the mask pattern 845 may include a first portion 840a having a first sidewall and a second portion 840b having a second sidewall, the second sidewall having a different inclination from the first sidewall. For example, the first portion 840a of the oxide mask 840 may have a sidewall substantially perpendicular to a surface of the underlying layer pattern 825a; and the second portion 840b may have an inclined sidewall that gradually increases the width of the second portion 840b from a bottom to a top thereof. For example, the width of the oxide mask 840 may be increased from an interface B between the first portion 840a and the second portion 840b to a top surface of the second portion 840b. Thus, the mask pattern 845 may be composed of the portions 835 and 840a having the first width, and the portion 840b having a width greater than the first width.

An inter-metal insulating layer 865 may be provided on the substrate having the mask pattern 845. A second conductive line 875 in electrical contact with the mask pattern 845 may be provided on the inter-metal insulating layer 865.

In an implementation, the second conductive line 875 may be in direct contact with the mask pattern 845. In another implementation, the second conductive line 875 may be in electrical contact with the mask pattern 845 through an upper plug (see FIG. 12).

Figure 14:
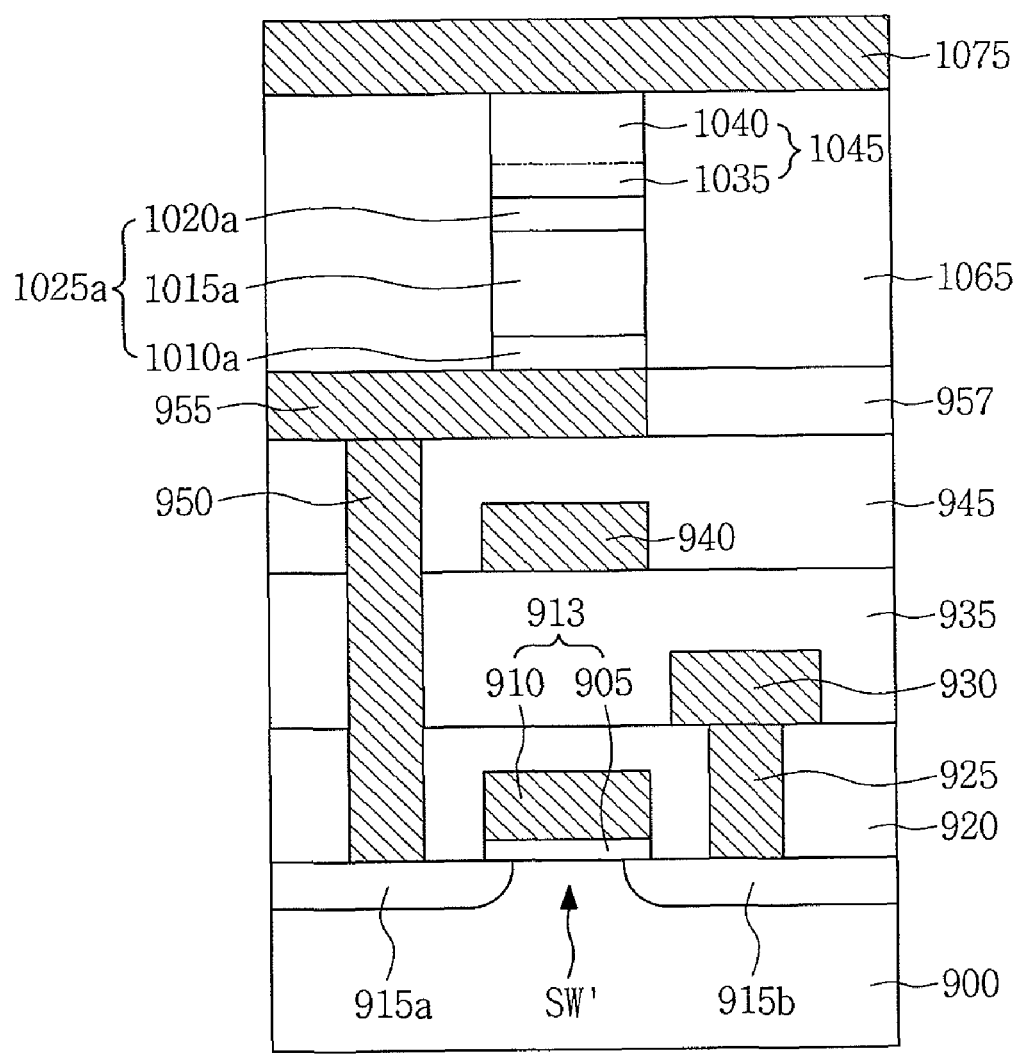
FIG. 14 illustrates a cross-sectional view of a semiconductor device according to yet another embodiment.

A semiconductor device according to still another embodiment will be described with reference to FIG. 14. FIG. 14 illustrates a cross-sectional view of a semiconductor device according to yet another embodiment.

Referring to FIG. 14, a substrate 900 may be provided. The substrate 900 may be a semiconductor substrate including a semiconductor material. Similar to the embodiment illustrated in FIG. 12, a switching device SW' may be provided in the substrate 900. The switching device SW' may be a MOS transistor. For example, the switching device SW' may be a MOS transistor including a gate pattern 913 on the substrate 900 and source and drain regions 915a and 915b in the substrate 900 on both sides of the gate pattern 913. The gate pattern 913 may include a gate dielectric layer 905 and a gate electrode 910, which may be sequentially stacked on an active region of the substrate 900. The gate electrode 910 may be on the active region of the substrate 900 and may extend onto a field region to serve as a word line.

An interlayer insulating layer 920 may be provided on the substrate 900 having the switching device SW'. A first conductive line 930 may be provided on the first interlayer insulating layer 920. A conductive plug 925 may be provided between one of the source and drain regions 915a and 915b and the first conductive line 930.

When the semiconductor device according to the embodiments is an MRAM, the first conductive line 930 may be defined as a source line.

A second interlayer insulating layer 935 may be provided on the substrate 900 having the first conductive line 930. A digit line 940 of the MRAM may be provided on the second interlayer insulating layer 935.

A third interlayer insulating layer 945 may be provided on the substrate having the digit line 940. A plug structure 950 passing through the first to third interlayer insulating layers 920, 935, and 945 may be provided. A lower electrode 955 may be provided on the third interlayer insulating layer 945. A fourth interlayer insulating layer 957 surrounding a sidewall of the lower electrode 955 may be provided.

An underlying layer pattern 1025a corresponding to one of the underlying layer patterns 25a, 225a, 325a, 425a, and 525a described above may be provided on the lower electrode 955. The underlying layer pattern 1025a may include a lower pattern 1010a, a data storage pattern 1015a, and an upper pattern 1020a, which may be sequentially stacked.

A conductive mask pattern 1045 may be provided on the underlying layer pattern 1025a. The mask pattern 1045 may correspond to one of the mask pattern 45 of FIG. 5F, the mask pattern 245 of FIG. 7B, the mask pattern 345 of FIG. 8C, and the mask pattern 540 of FIG. 10C.

In an implementation, the mask pattern 1045 may be formed of an oxide mask 1040. In another implementation, the mask pattern 1045 may be formed of a mask layer 1035 and the oxide mask 1040, which may be sequentially stacked.

An inter-metal insulating layer 1065 surrounding sidewalls of the underlying layer pattern 1025a and the mask pattern 1045 may be provided. A second conductive line 1075 may be provided on the inter-metal insulating layer 1065.

In an implementation, the second conductive line 1075 may be directly in electrical contact with the mask pattern 1045. In another implementation, an upper plug (see FIG. 12) interposed between the second conductive line 1075 and the mask pattern 1045 may be provided, such that the second conductive line 1075 may be in electrical contact with the mask pattern 1045 using the upper plug.

Figure 15:
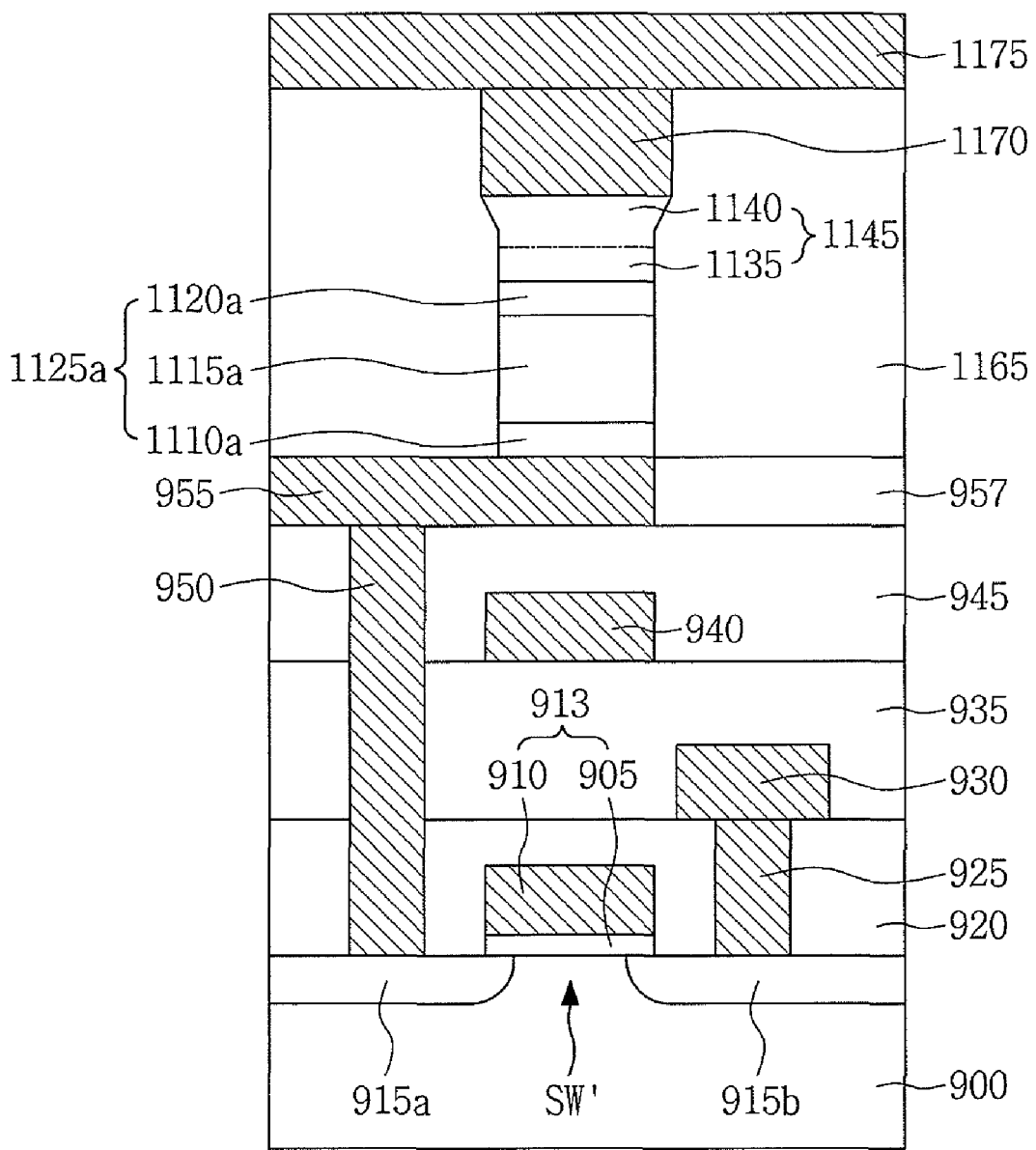
FIG. 15 illustrates a cross-sectional view of a semiconductor device according to still another embodiment.

Next, a semiconductor device according to yet another embodiment will be described with reference to FIG. 15. FIG. 15 illustrates a cross-sectional view of a semiconductor device according to still another embodiment.

Referring to FIG. 15, an underlying layer pattern 1125a corresponding to one of the underlying layer patterns 25a, 225a, 325a, 425a, and 525a described above may be provided on the lower electrode 955 illustrated in FIG. 14. The underlying layer pattern 1125a may include a lower pattern 1110a, a data storage pattern 1115a, and an upper pattern 1120a, which may be sequentially stacked.

A conductive mask pattern 1145 may be provided on the underlying layer pattern 1125a. The mask pattern 1145 may be formed of an oxide mask 1040, or a mask layer 1135 and the oxide mask 1140, which may be sequentially stacked.

The mask pattern 1145 may correspond to the mask pattern 845 described with respect to FIG. 13. Thus, as described with respect to FIG. 13, the mask pattern 1145 may include a first portion having a first sidewall and a second portion having a second sidewall with a different inclination from the first sidewall. The first and second portions have been described with respect FIG. 13, and thus repeated detailed descriptions thereof will be omitted.

An inter-layer insulating layer 1165 may be provided on the substrate 900 having the mask pattern 1145. A second conductive line 1175 in electrical contact with the mask pattern 1145 may be provided on the inter-metal insulating layer 1165.

In an implementation, an upper plug 1170 may be provided between the second conductive line 1175 and the mask pattern 1145. In another implementation, without the upper plug 1170, the second conductive line 1175 may be directly in electrical contact with the mask pattern 1145.

The semiconductor device according to the embodiments may be realized in various types of devices and/or systems, or used as an element for the various devices and/or systems. For example, the semiconductor device may be applied to realize various types of memory devices, for example, a memory card, a USB memory, and a solid-state driver.

FIGS. 16 to 23 illustrate diagrams of devices and systems including a semiconductor device according to an embodiment.

Figure 16:
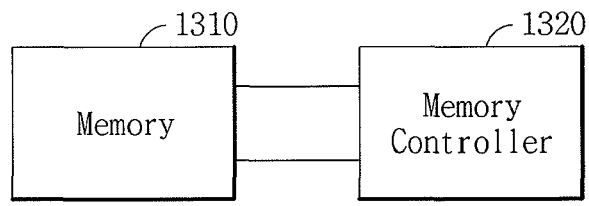
FIGS. 16 through 23 illustrate diagrams of devices and systems including a semiconductor device according to an embodiment.

FIG. 16 schematically illustrates a device including a memory 1310 and a memory controller 1320. The memory 1310 may include a data storage pattern formed according to any one of the embodiments described above. The memory controller 1320 may provide an input signal controlling an operation of the memory 1310. For example, the memory controller 1320 may provide a command and an address signal. The memory controller 1320 may control the memory 1310 on the basis of a received control signal.

The memory 1310 and/or the controller 1320 may be mounted using various types of packages. For example, the memory 1310 and/or the controller 1320 may be mounted using packages such as package on packages (PoPs), ball grid arrays (BGAs), chip scale packages (CSPs), plastic leaded chip carriers (PLCCs), plastic dual in-line packages (PDIPs), die in waffle packs, die in wafer forms, chip on boards (COBs), ceramic dual in-line packages (CERDIPs), plastic metric quad flat packs (MQFPs), thin quad flat packs (TQFPs), small outline integrated circuits (SOICs), shrink small outline packages (SSOPs), thin small outline packages (TSOPs), system in packages (SIPs), multi chip packages (MCPs), wafer-level fabricated packages (WFPs), or wafer-level processed stack packages (WSPs).

Figure 17:
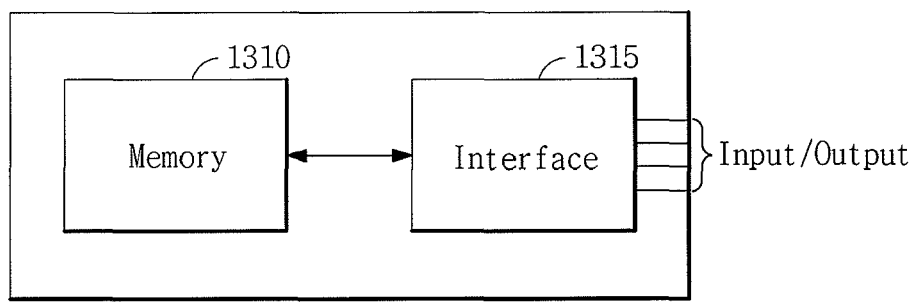

FIG. 17 schematically illustrates a device including a memory 1310 connected with an interface 1315. The memory 1310 may include a data storage pattern formed according to any one of the embodiments described above. The interface 1315 may provide an input signal generated from outside. For example, the interface 1315 may provide a command and an address signal.

Figure 18:
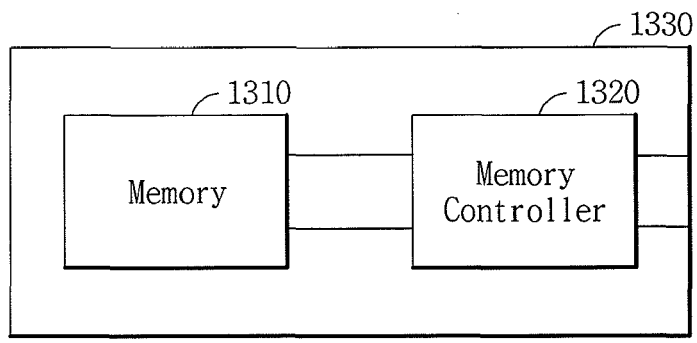

FIG. 18 illustrates a schematic diagram of a memory card 1330. The memory 1310 and the memory controller 1320 described in FIG. 16 may be realized as a memory card 1330. The memory card 1330 may be a memory card used for a device, e.g., a digital camera or a computer.

Figure 19:
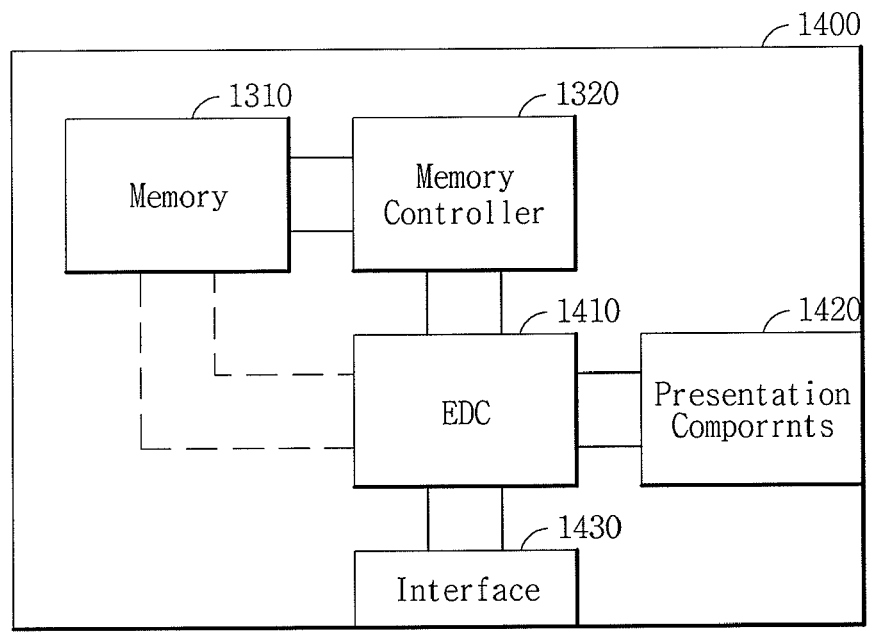

FIG. 19 illustrates a schematic diagram of a portable device 1400. The portable device 1400 may include, e.g., an MP3 player, a video player, or a video and audio player. The portable device 1400 may include a memory 1310 and a memory controller 1320. The memory 1310 may include a data storage pattern formed according to any one of the embodiments described above. The portable device 1400 may include an encoder and decoder (EDC) 1410, a presentation component 1420, and an interface 1430. Data may be sent or received between the memory 1310 and the EDC 1410 via the memory controller 1320. As drawn with the dotted line, data may be directly sent or received between the memory 1310 and the EDC 1410.

The EDC 1410 may encode data to be stored in the memory 1310. For example, the EDC 1410 may encode audio data in MP3 format, and store it in the memory 1310. In addition, the EDC 1410 may encode MPEG video data (e.g., MPEG3 or MPEG4) and store it in the memory 1310. The EDC 1410 may include a plurality of encoders encoding different types of data according to data formats. For example, the EDC 1410 may include an MP3 encoder for audio data and an MPEG encoder for video data. The EDC 1410 may decode audio data output from the memory 1310 in MP3 format.

In addition, the EDC 1410 may decode video data output from the memory 1310 in MPEG format (e.g., MPEG3 or MPEG4). The EDC 1410 may include a plurality of decoders decoding different types of data according to data formats. For example, the EDC 1410 may include an MP3 decoder for audio data and an MPEG decoder for video data. Alternatively, the EDC 1410 may include only a decoder. For example, data previously encoded may be transmitted to the EDC 1410 to be decoded, and then transmitted to the memory controller 1320 and/or the memory 1310.

The EDC 1410 may receive data to be encoded or data previously encoded via the interface 1430. The interface 1430 may follow well known standards (e.g., USB or fire wire). The interface 1430 may include at least one interface. Data provided from the memory 1310 may be output through the interface 1430.

The presentation component 1420 may display data decoded by the memory 1310 and/or the EDC 1410 for a user to recognize. For example, the presentation component 1420 may include a display screen outputting video data and/or a speaker jack outputting audio data.

Figure 20:
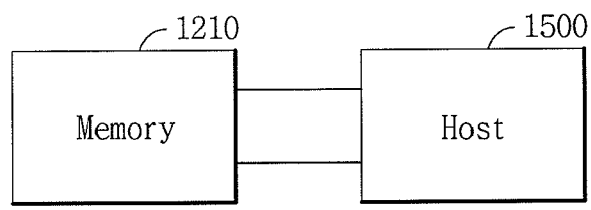

FIG. 20 illustrates a schematic diagram of a host system 1500 connected with the memory 1310. The memory 1310 may include a data storage pattern formed according to any one of the embodiments described above. The host system 1500 may be a processing system of a computer or a digital camera. The memory 1310 may provide a detachable data storage medium, e.g., a memory card, a USB memory, or a solid-state driver (SSD). The host system 1500 may provide a command and an address signal.

Figure 21:
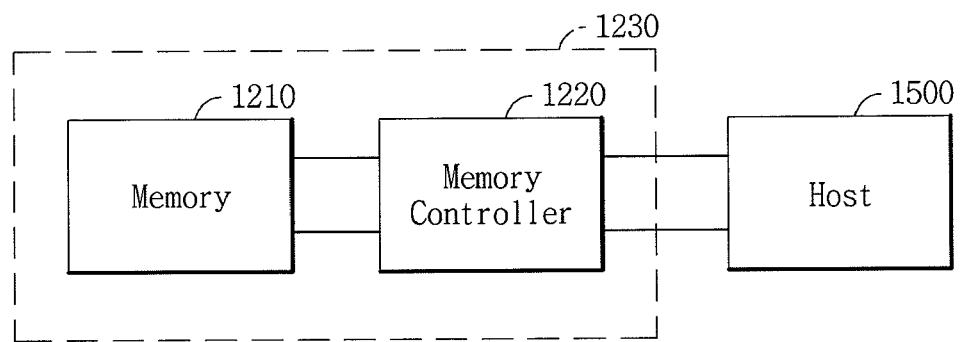

FIG. 21 illustrates a schematic diagram of a host system 1500 connected with a memory card 1230. The host system 1500 may be connected with the memory card 1230 described with respect to FIG. 18. The host system 1500 may provide a control signal to the memory card 1230 to control operations of a memory controller 1220 and a memory 1210.

Figure 22:
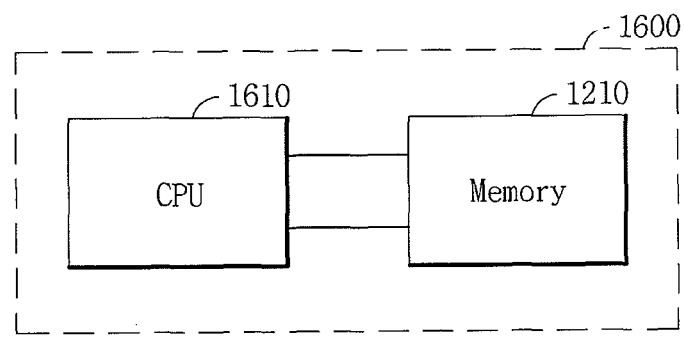

FIG. 22 illustrates a schematic diagram of a computer system 1600. The memory 1210 may be connected with a central processing unit (CPU) 1610 in the computer system 1600. For example, the computer system 1600 may be a personal computer or a personal digital assistant (PDA). The memory 1210 may be connected with the CPU 1610 via a BUS.

Figure 23:
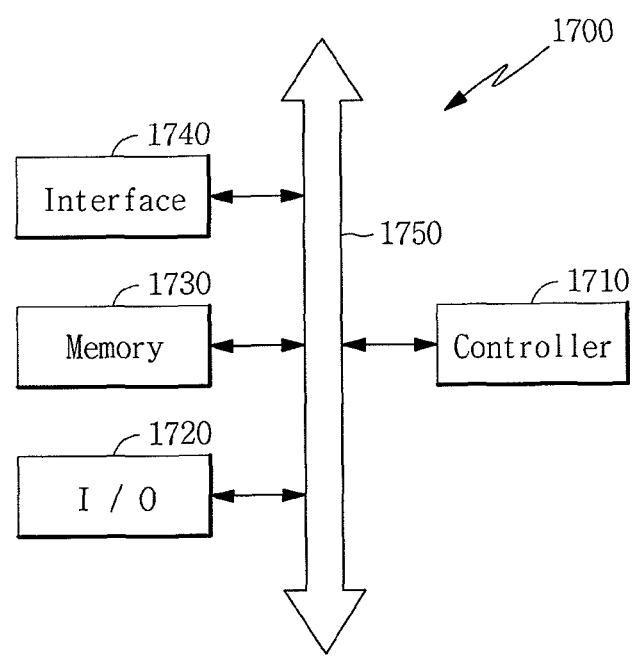

FIG. 23 illustrates a schematic diagram of a device including a controller 1710, an I/O device 1720, a memory 1730, and an interface 1740. All components of the device 1700 may be connected with each other via the BUS 1750.

The memory 1730 may include a data storage pattern formed according to any one of the embodiments described above. The I/O device 1720 may be a device, e.g., a keyboard or a display. The controller 1710 may include at least one of a microprocessor, a digital processor, a microcontroller, or a processor. The memory 1730 may store data and/or a command run by the controller 1710. The interface 1740 may be used to transmit communication network data from another system, for example, a communication network.

The device 1700 may be a mobile system, e.g., a PDA, a portable computer, a web tablet, a wireless phone, a mobile phone, a digital music player, a memory card, or a system capable of sending and/or receiving data.

According to the embodiments, a mask pattern including an oxide mask may be provided. A method of fabricating a semiconductor device having the oxide mask may also be provided. The oxide mask may be formed by oxidizing a metal layer thereunder. As a result, in the oxide mask, a defect, e.g., a seam generated in the mask layer, may be removed. Thus, the embodiments may provide an oxide mask without a defect, e.g., a seam.

In addition, a lower region of the oxide mask may be formed to at least have a substantially perpendicular sidewall relative to the surface of the underlying layer pattern. Thus, the underlying layer pattern also having a substantially perpendicular sidewall, e.g., parallel to the sidewall of the mask pattern, may be formed using the oxide mask. As a result, a distance between the underlying layer patterns, which may be adjacent to each other, may be ensured. Thus, an electrical short circuit between the adjacent underlying patterns may be prevented.

The embodiments provide a method of forming a mask pattern including an oxide mask to pattern an underlying layer.

The embodiments also provide a method of fabricating a semiconductor device having the oxide mask.

The embodiments also provide a method of forming a mask pattern to form an underlying layer pattern having a substantially perpendicular sidewall.

The embodiments also provide a method of fabricating a semiconductor device having a data storage pattern with a substantially perpendicular sidewall.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, the method comprising:
    providing a substrate;
    forming an underlying layer on the substrate;
    forming a sacrificial layer on the underlying layer;
    forming an opening in the sacrificial layer by patterning the sacrificial layer such that the opening exposes a predetermined region of the underlying layer;
    forming a mask layer in the opening;
    forming an oxide mask by partially or completely oxidizing the mask layer such that the oxide mask includes a first portion having a first width and a second portion having a second width, the second width being greater than the first width;
    removing the sacrificial layer; and
    etching the underlying layer using the oxide mask as an etch mask to form an underlying layer pattern.

2. The method as claimed in claim 1, wherein the mask layer is formed of a metal layer.

3. The method as claimed in claim 1, wherein the oxide mask is formed of a conductive metal oxide.

4. The method as claimed in claim 1, further comprising performing a process of decreasing a thickness of the oxide mask.

5. The method as claimed in claim 1, further comprising partially planarizing the oxide mask to reduce a thickness of the oxide mask.

6. The method as claimed in claim 1, wherein:
    forming the mask layer includes generating a defect in an upper region of the mask layer, and
    forming the oxide mask includes removing the defect.

7. The method as claimed in claim 1, wherein the oxide mask has a resistance value of less than half of a resistance value of the underlying layer.

8. The method as claimed in claim 1, wherein the sacrificial layer has a thickness of a first dimension, the opening has a width of a second dimension, and the first dimension is about 0.5 to about 1.5 times the second dimension.

9. The method as claimed in claim 1, wherein a height of a mask structure including the mask layer and the oxide mask is about 1 to about 3 times a thickness of the underlying layer.

10. The method as claimed in claim 9, wherein the height of the mask structure including the mask layer and the oxide mask is about 1 to about 1.5 times the thickness of the underlying layer.

11. The method as claimed in claim 1, wherein forming the mask layer includes:
    forming a conductive material layer on the substrate including the sacrificial layer having the opening, and
    planarizing the conductive material layer until a top surface of the sacrificial layer is exposed.

12. The method as claimed in claim 1, wherein the oxide mask includes a portion extending above the sacrificial layer.

13. The method as claimed in claim 1, wherein the first portion of the oxide mask has a sidewall substantially perpendicular to a surface of the underlying layer.

14. The method as claimed in claim 1, wherein:
    the first portion of the oxide mask is in the opening, and
    the second portion of the oxide mask is on the first portion.

15. The method as claimed in claim 1, wherein the second width of the second portion of the oxide mask is gradually increased from an interface with the first portion toward a top thereof.

16. The method as claimed in claim 1, wherein forming the mask layer includes partially filling the opening.

17. A method of fabricating a semiconductor device, the method comprising:
    providing a substrate;
    forming an underlying layer on the substrate;
    forming a sacrificial layer on the underlying layer;
    forming an opening in the sacrificial layer by patterning the sacrificial layer such that the opening exposes a predetermined region of the underlying layer;
    forming a spacer on a sidewall of the opening;
    forming a mask layer in the opening including the spacer therein;
    forming an oxide mask by partially or completely oxidizing the mask layer;
    removing the sacrificial layer and the spacer;
    etching the underlying layer using the oxide mask as an etch mask to form an underlying layer pattern.

18. The method as claimed in claim 1, wherein the underlying layer includes a data storage material layer, the data storage material layer remaining in the underlying layer pattern and forming a data storage pattern, the data storage pattern being an element for storing data of a non-volatile RAM.

19. A method of fabricating a semiconductor device, the method comprising:
    providing a substrate having a switching device;
    forming an underlying layer on the substrate, the underlying layer including a sequentially stacked conductive lower layer, data storage layer, and conductive upper layer, the conductive lower layer being in electrical contact with the switching device;
    forming a sacrificial layer on the underlying layer;
    patterning the sacrificial layer to form an opening exposing a predetermined region of the underlying layer;
    forming a metal layer in the opening;
    partially or completely oxidizing the metal layer to form an oxide mask formed of a conductive metal oxide;
    etching the sacrificial layer using the oxide mask directly as an etch mask to remove the sacrificial layer;
    etching the underlying layer using the oxide mask directly as an etch mask to form an underlying layer pattern, the underlying layer pattern including a sequentially stacked lower pattern, data storage pattern, and upper pattern, the data storage pattern being a data storage element of a non-volatile memory device;
    forming an inter-metal insulating layer on the substrate having the underlying layer pattern; and
    forming a conductive line in electrical contact with the oxide mask on the inter-metal insulating layer.

20. The method as claimed in claim 19, wherein the oxide mask includes a first portion having a first width and a second portion having a second width, the second width being greater than the first width.

* * * * *